(12) United States Patent
Nomura

(10) Patent No.: US 9,723,235 B2
(45) Date of Patent: Aug. 1, 2017

(54) SOLID-STATE IMAGING DEVICE AND DRIVING METHOD THEREOF, AND ELECTRONIC APPARATUS

(71) Applicant: Sony Corporation, Tokyo (JP)

(72) Inventor: Hirotoshi Nomura, Kanagawa (JP)

(73) Assignee: Sony Corporation, Tokyo (JP)

( * ) Notice: Subject to any disclaimer, the term of this patent is extended or adjusted under 35 U.S.C. 154(b) by 42 days.

(21) Appl. No.: 14/311,985

(22) Filed: Jun. 23, 2014

(65) Prior Publication Data

US 2015/0002718 A1 Jan. 1, 2015

(30) Foreign Application Priority Data

Jun. 28, 2013 (JP) ................... 2013-136216

(51) Int. Cl.
H04N 5/335 (2011.01)
H04N 5/372 (2011.01)
(Continued)

(52) U.S. Cl.
CPC ..... *H04N 5/37213* (2013.01); *H01L 27/1463* (2013.01); *H01L 27/1464* (2013.01);
(Continued)

(58) Field of Classification Search
CPC .............. H04N 5/37213; H04N 5/3742; H01L 27/1463; H01L 27/14609; H01L 27/14623; H01L 27/1464
(Continued)

(56) References Cited

U.S. PATENT DOCUMENTS 8,711,258 B2 * 4/2014 Takase ................ G02B 3/0068
250/208.1
2006/0097296 A1 * 5/2006 Nam .................. H01L 27/14603
257/292
(Continued)

FOREIGN PATENT DOCUMENTS

JP 2004-306144 A 11/2004
JP 2007-025807 A 2/2007
(Continued)

*Primary Examiner* — Sinh Tran
*Assistant Examiner* — Zhenzhen Wu
(74) *Attorney, Agent, or Firm* — Sheridan Ross P.C.

(57) ABSTRACT

A solid-state imaging device includes a photoelectric conversion unit, a light shielding unit and a transfer transistor. The photoelectric conversion unit generates charges by photoelectrically converting light. The light shielding unit is formed by engraving a semiconductor substrate on which the photoelectric conversion unit is formed, so as to surround an outer periphery of the photoelectric conversion unit. The transfer transistor transfers charges generated in the photoelectric conversion unit. During a charge accumulation period in which charges are accumulated in the photoelectric conversion unit, a potential that repels the charges is supplied to the light shielding unit and a gate electrode of the transfer transistor. During a charge transfer period in which charges are transferred from the photoelectric conversion unit, a potential that repels the charges is supplied to the light shielding unit and a potential that attracts the charges is supplied to the gate electrode of the transfer transistor.

17 Claims, 22 Drawing Sheets

(51) Int. Cl.
*H01L 27/146* (2006.01)
*H04N 5/374* (2011.01)

(52) U.S. Cl.
CPC .. *H01L 27/14609* (2013.01); *H01L 27/14623* (2013.01); *H04N 5/3742* (2013.01)

(58) Field of Classification Search
USPC ............... 348/294, 308, 311; 250/208.1
See application file for complete search history.

(56) References Cited

U.S. PATENT DOCUMENTS

| | | | |
|---|---|---|---|
| 2006/0278896 A1* | 12/2006 | Inoue | H01L 27/14623 257/215 |
| 2007/0278535 A1* | 12/2007 | Watanabe | H01L 27/14812 257/233 |
| 2008/0283726 A1* | 11/2008 | Uya | H01L 27/14603 250/208.1 |
| 2008/0296640 A1* | 12/2008 | Hiyama | H01L 27/14601 257/291 |
| 2011/0183709 A1* | 7/2011 | Roy | H01L 27/14603 455/556.1 |
| 2012/0012965 A1* | 1/2012 | Maeda | H04N 5/37457 257/435 |
| 2012/0217494 A1* | 8/2012 | Okino | H01L 27/14625 257/43 |
| 2014/0110809 A1* | 4/2014 | Kitamura | H01L 27/14623 257/435 |

FOREIGN PATENT DOCUMENTS

| | | |
|---|---|---|
| JP | 2010-169911 A | 8/2010 |
| JP | 2011-040531 A | 2/2011 |

\* cited by examiner

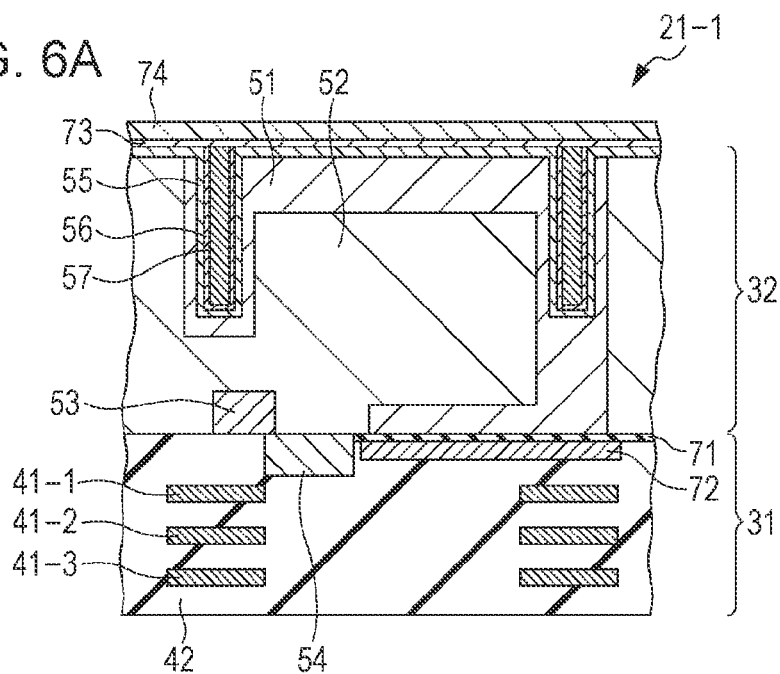
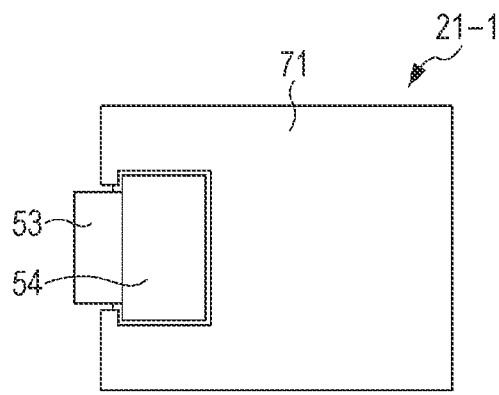
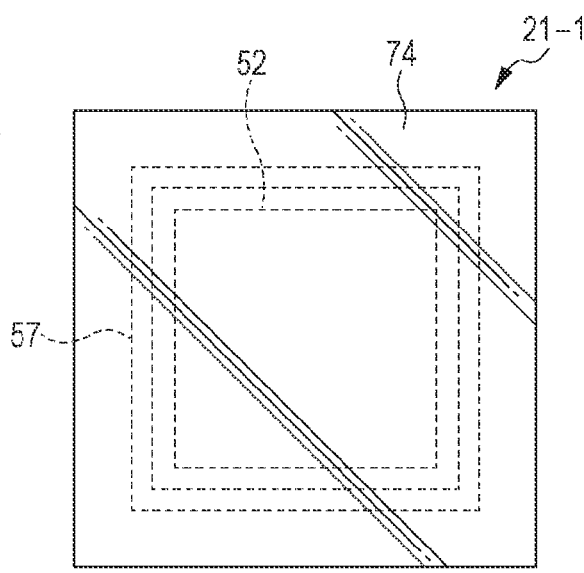

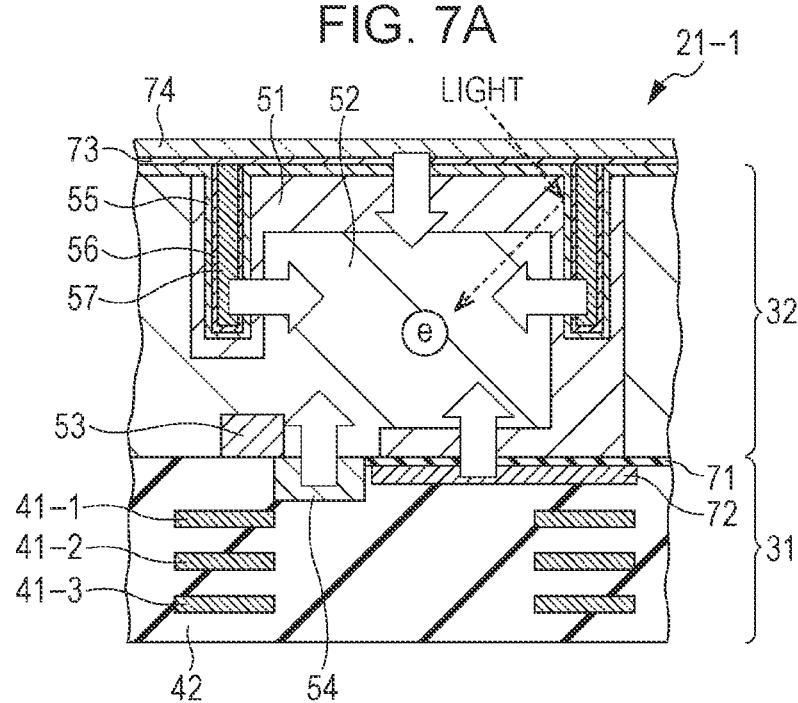
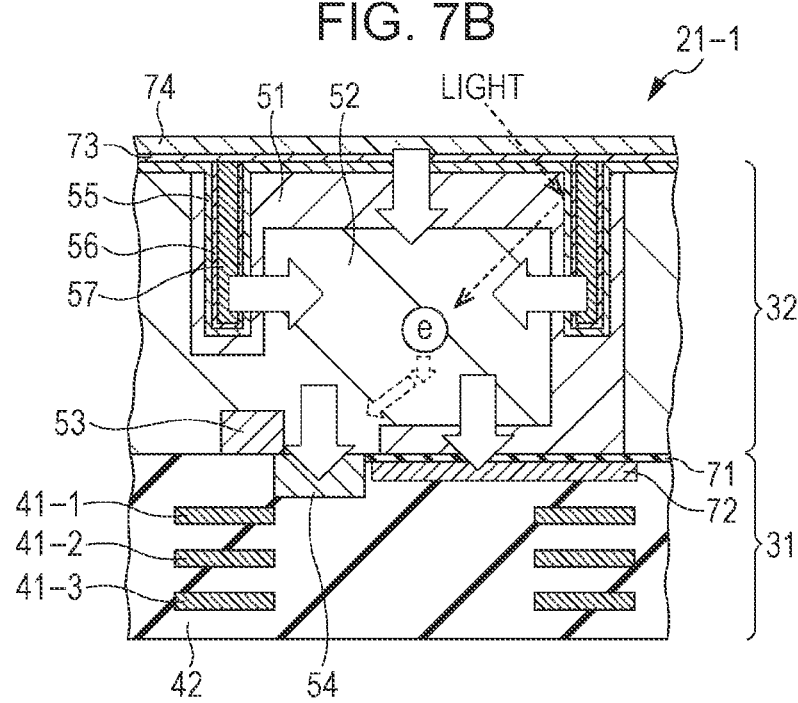

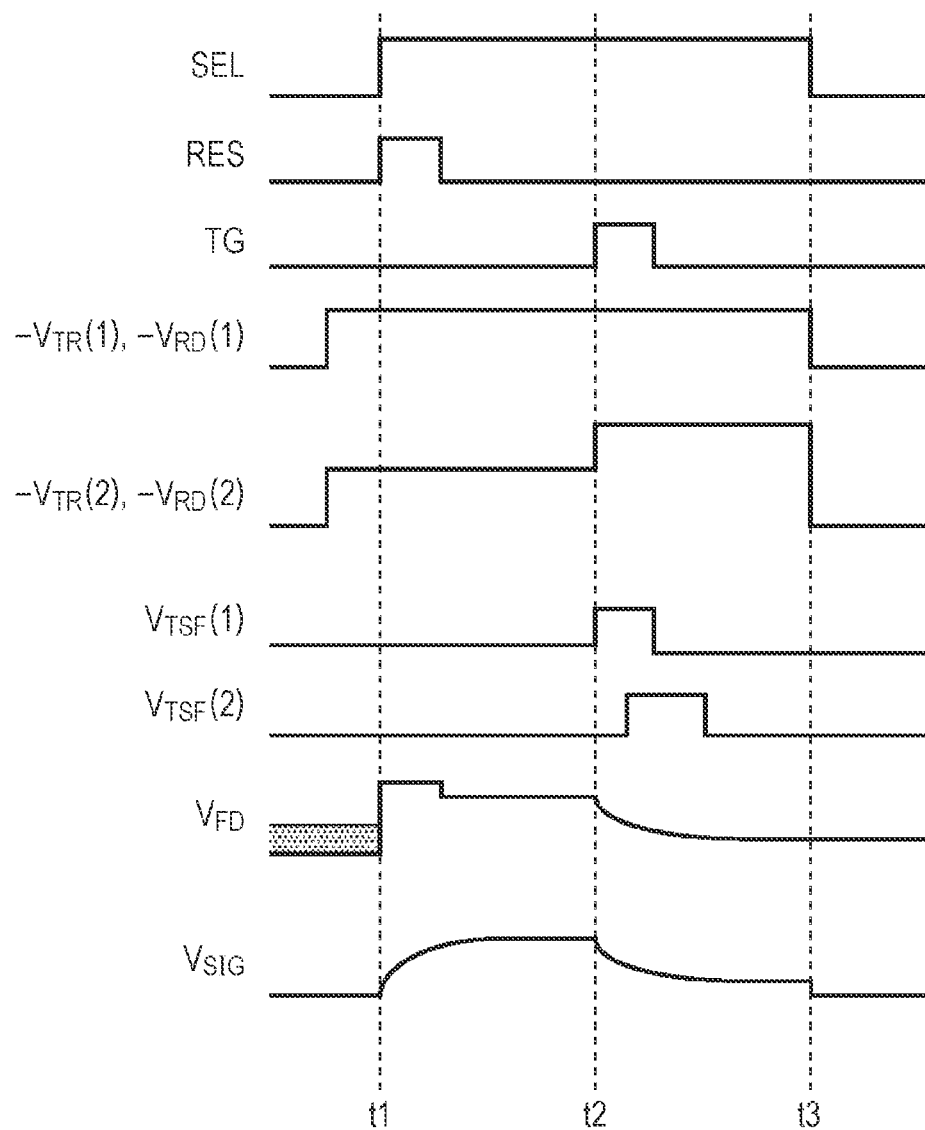

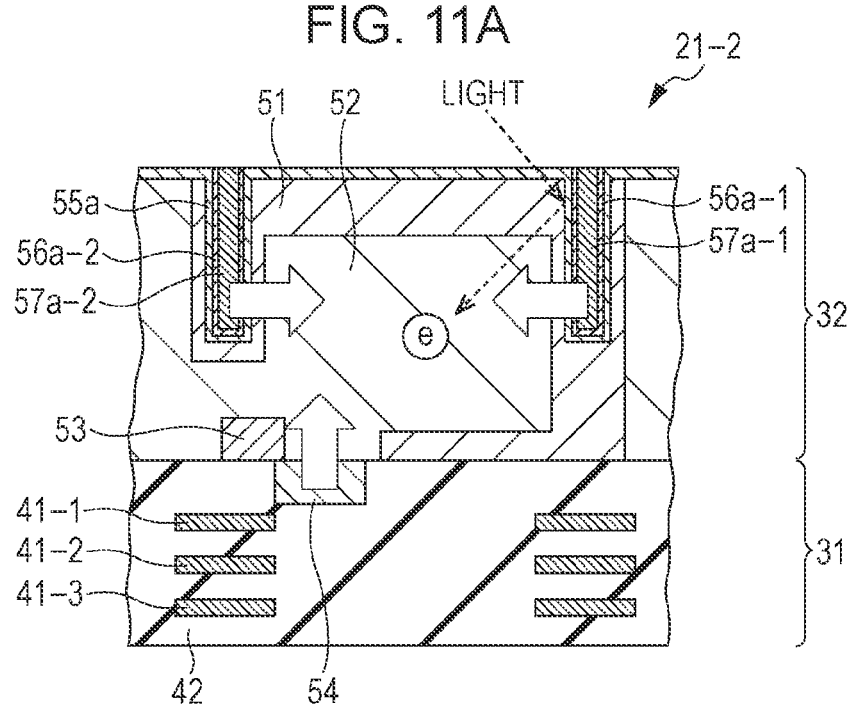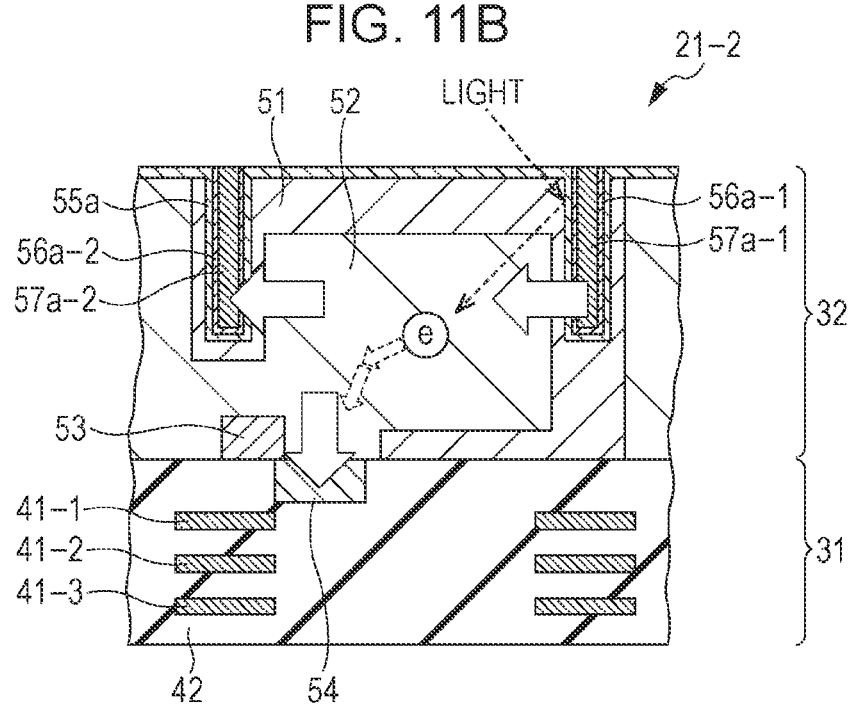

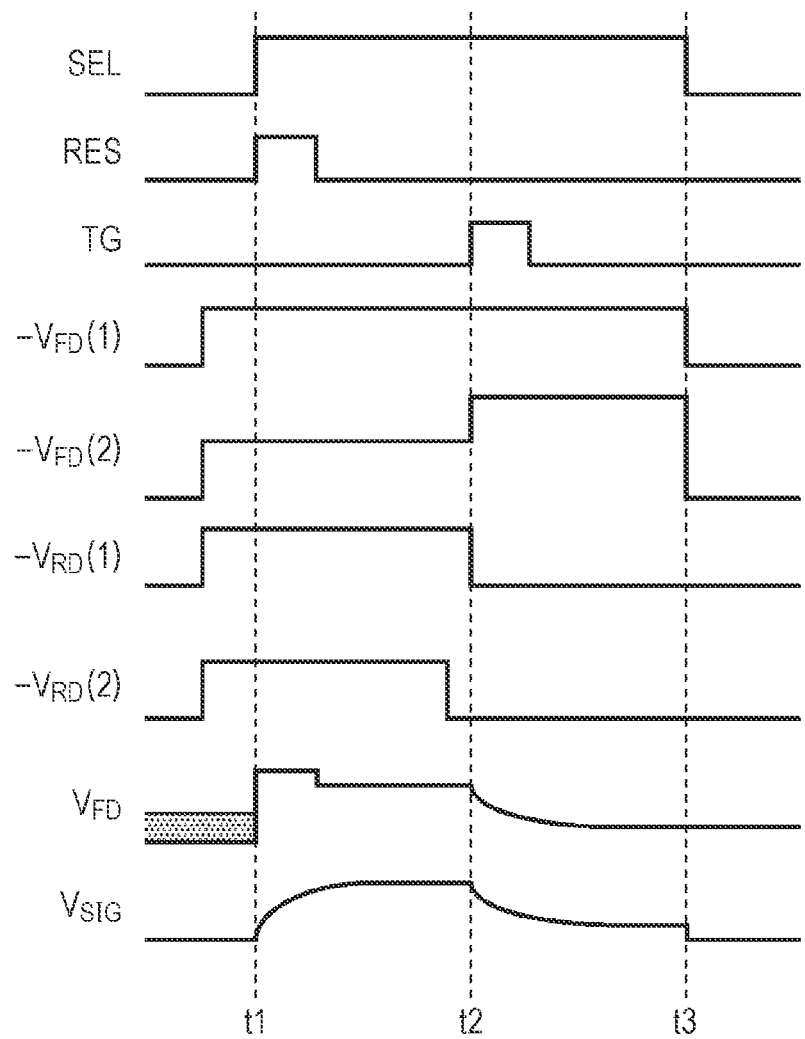

SOLID-STATE IMAGING DEVICE AND DRIVING METHOD THEREOF, AND ELECTRONIC APPARATUS

CROSS REFERENCE TO RELATED APPLICATIONS

This application claims the benefit of Japanese Priority Patent Application JP 2013-136216 filed Jun. 28, 2013, the entire contents of which are incorporated herein by reference.

BACKGROUND

The present disclosure relates to a solid-state imaging device and a driving method thereof, and an electronic apparatus, and in particular, to a solid-state imaging device and a driving method thereof, and an electronic apparatus, capable of improving characteristics of pixels.

In the related art, in electronic apparatuses with imaging functions, such as digital still cameras and digital video cameras, solid-state imaging devices such as, a Charge Coupled Device (CCD) and a Complementary Metal Oxide Semiconductor (CMOS) image sensor are used. The solid-state imaging devices include a pixel in which a photodiode (PD) performing photoelectric conversion and a plurality of transistors are combined and an image is formed based on pixel signals which are output from a plurality of the pixels which are arranged in a plane manner.

For example, in the solid-state imaging device, charges accumulated in the PD are transferred to a Floating Diffusion (FD) unit having a predetermined capacity which is provided in a connection portion between the PD and a gate electrode of an amplifying transistor. Then, signals corresponding to a level of the charges stored in the FD unit are read from the pixel and AD-converted by an Analog Digital (AD) conversion circuit having a comparator so as to output the AD-converted signals.

In recent years, the solid-state imaging devices tend to have many pixels. Thus, when a pixel miniaturization is intended without changing the chip size, there is a problem that the light incident characteristics deteriorate and color mixing occurs between pixels.

For example, Japanese Unexamined Patent Application Publication No. 2010-169911 discloses a solid-state imaging device which performs an element separation optically and electrically by embedding an inter-pixel element separation film and a pixel light shielding film on a side on which light of a PD is incident, in order to reduce the color mixing between pixels. Further, Japanese Unexamined Patent Application Publication No. 2011-40531 discloses a solid-state imaging device that suppresses generation of a dark current by employing a fixed charge film.

Further, it has been known that the color mixing between pixels can be significantly reduced by employing an embedding technology in the solid-state imaging device.

Furthermore, Japanese Unexamined Patent Application Publication No. 2004-306144 discloses a solid-state imaging device that assists a charge transfer, for example, by applying a voltage to a poly-silicon embedded in a trench portion other than a drive signal of a normal pixel. Further, it is possible to intend to suppress the dark current, to improve a saturation charge amount, and to realize a low voltage drive, by applying a voltage to the trench portion.

In addition, Japanese Unexamined Patent Application Publication No. 2007-25807 discloses a solid-state imaging device capable of intending to suppress the dark current and of improving the saturation charge amount, by providing electrodes in an upper part and a lower part of the PD so as to apply a suitable voltage.

SUMMARY

However, in the solid-state imaging devices described above, it is not assumed that a potential is applied to a light shielding film and there is a problem that optical color mixing between pixels deteriorates when a pixel miniaturization is processed. Thus, the characteristics of the pixels deteriorate.

The present disclosure is made in view of such circumstances and intended to improve the characteristics of pixels.

According to an embodiment of the present disclosure, there is provided a solid-state imaging device including: a photoelectric conversion unit that generates charges by photoelectrically converting light; a light shielding unit that is formed by engraving a semiconductor substrate on which the photoelectric conversion unit is formed, so as to surround an outer periphery of the photoelectric conversion unit; and a transfer transistor that transfers charges generated in the photoelectric conversion unit, wherein during a charge accumulation period in which charges are accumulated in the photoelectric conversion unit, a potential that repels the charges is supplied to the light shielding unit and a gate electrode of the transfer transistor, and wherein during a charge transfer period in which charges are transferred from the photoelectric conversion unit, a potential that repels the charges is supplied to the light shielding unit and a potential that attracts the charges is supplied to the gate electrode of the transfer transistor.

According to another embodiment of the present disclosure, there is provided a driving method of a solid-state imaging device including a photoelectric conversion unit that generates charges by photoelectrically converting light, a light shielding unit that is formed by engraving a semiconductor substrate on which the photoelectric conversion unit is formed, so as to surround an outer periphery of the photoelectric conversion unit, and a transfer transistor that transfers charges generated in the photoelectric conversion unit, including: supplying a potential that repels the charges to the light shielding unit and a gate electrode of the transfer transistor, during a charge accumulation period in which charges are accumulated in the photoelectric conversion unit; and supplying a potential that repels the charges to the light shielding unit and supplying a potential that attracts the charges to the gate electrode of the transfer transistor, during a charge transfer period in which charges are transferred from the photoelectric conversion unit.

According to still another embodiment of the present disclosure, there is provided an electronic apparatus including: a solid-state imaging device including a photoelectric conversion unit that generates charges by photoelectrically converting light; a light shielding unit that is formed by engraving a semiconductor substrate on which the photoelectric conversion unit is formed, so as to surround an outer periphery of the photoelectric conversion unit; and a transfer transistor that transfers charges generated in the photoelectric conversion unit, wherein during a charge accumulation period in which charges are accumulated in the photoelectric conversion unit, a potential that repels the charges is supplied to the light shielding unit and a gate electrode of the transfer transistor, and wherein during a charge transfer period in which charges are transferred from the photoelectric conversion unit, a potential that repels the charges is supplied to the light shielding unit and a potential that attracts the charges is supplied to the gate electrode of the transfer transistor.

In the embodiments, during a charge accumulation period in which charges are accumulated in the photoelectric conversion unit, a potential that repels the charges is supplied to the light shielding unit and a gate electrode of the transfer transistor, and during a charge transfer period in which charges are transferred from the photoelectric conversion unit, a potential that repels the charges is supplied to the light shielding unit and a potential that attracts the charges is supplied to the gate electrode of the transfer transistor.

According to the embodiments of the present disclosure, it is possible to improve characteristics of pixels.

BRIEF DESCRIPTION OF THE DRAWINGS

FIGS. 6A to 6C are diagrams illustrating a second configuration example of a pixel;

FIGS. 7A and 7B are diagrams illustrating an operation of a potential applied during a charge accumulation period and during a charge transfer period;

FIG. 9 is a diagram illustrating a drive signal supplied to a pixel and potentials of respective units in the pixel;

FIGS. 11A and 11B are diagrams illustrating an operation of a potential applied during a charge accumulation period and during a charge transfer period;

FIG. 17 is a diagram illustrating a drive signal supplied to a pixel and potentials of respective units in the pixel;

DETAILED DESCRIPTION OF EMBODIMENTS

Hereinafter, specific embodiments to which the present technology is applied will be described in detail with reference to drawings.

Figure 1:
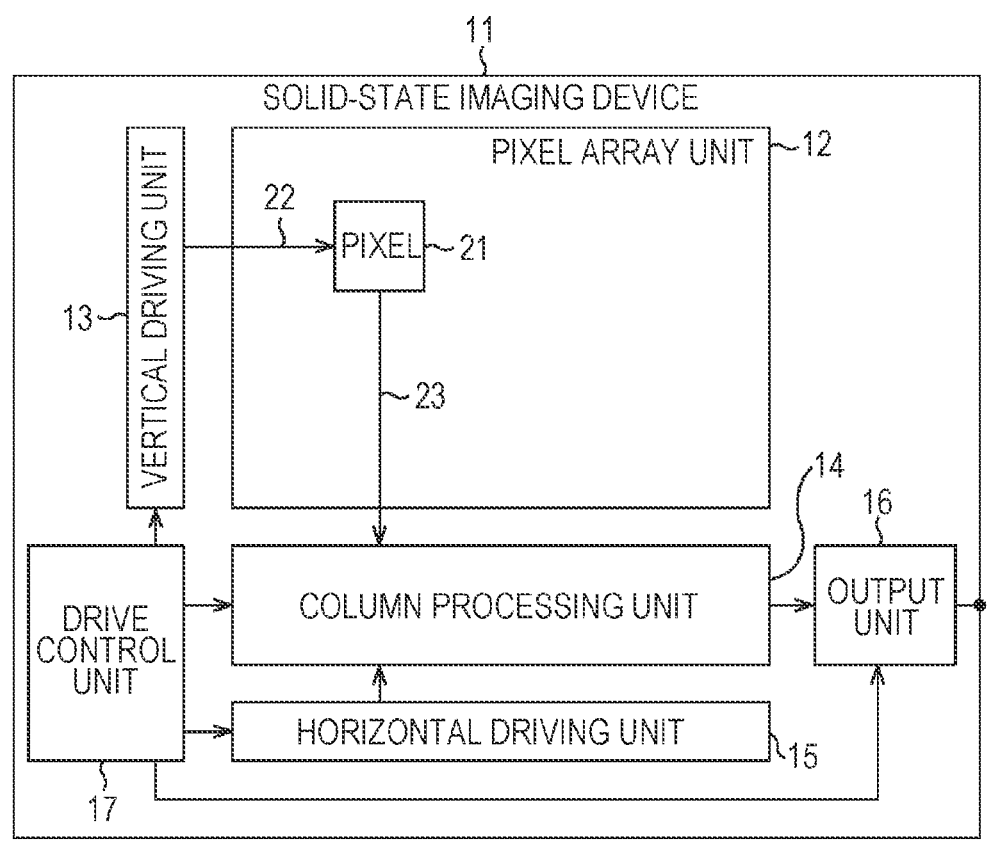
FIG. 1 is a block diagram illustrating a configuration example of a solid-state imaging device according to an embodiment of the present technology.

FIG. 1 is a block diagram illustrating a configuration example of an embodiment of a solid-state imaging device according to an embodiment of the present technology.

As illustrated in FIG. 1, a solid-state imaging device 11 is a CMOS-type solid-state imaging device, and is configured to include a pixel array unit 12, a vertical driving unit 13, a column processing unit 14, a horizontal driving unit 15, an output unit 16, and a driving control unit 17.

The pixel array unit 12 includes a plurality of pixels 21 which are arranged in an array shape, is connected to the vertical driving unit 13 through a plurality of horizontal signal lines 22 corresponding to the number of rows of the pixel 21, and is connected to the column processing unit 14 through a plurality of vertical signal lines 23 corresponding to the number of columns of the pixel 21. In other words, the plurality of pixels 21 included in the pixel array unit 12 are respectively disposed at points in which the horizontal signal lines 22 and the vertical signal lines 23 intersect.

The vertical driving unit 13 sequentially supplies drive signals for driving (transferring, selecting, resetting, or the like) the respective pixels 21 to respective rows of the plurality of pixels 21 included in the pixel array unit 12 through the horizontal signal line 22.

The column processing unit 14 extracts the signal levels of pixel signals by performing a Correlated Double Sampling (CDS) process on the pixel signals which are output from the respective pixels 21 and acquires pixel data corresponding to the amount of received light of the pixels 21, through the vertical signal line 23.

The horizontal driving unit 15 sequentially supplies the column processing unit 14 with drive signals for outputting the pixel data which is acquired from the respective pixels 21 from the column processing unit 14, for each column of the plurality of pixels 21 included in the pixel array unit 12.

The pixel data is supplied from the column processing unit 14 to the output unit 16 at a timing corresponding to the drive signal of the horizontal driving unit 15, and the output unit 16 amplifies, for example, the pixel data and outputs the amplified pixel data to an image processing circuit in the subsequent stage.

The driving control unit 17 controls the driving of each block in the solid-state imaging device 11. For example, the driving control unit 17 generates a block signal according to the driving period of each block and supplies the block signal to each block.

Figure 2A:
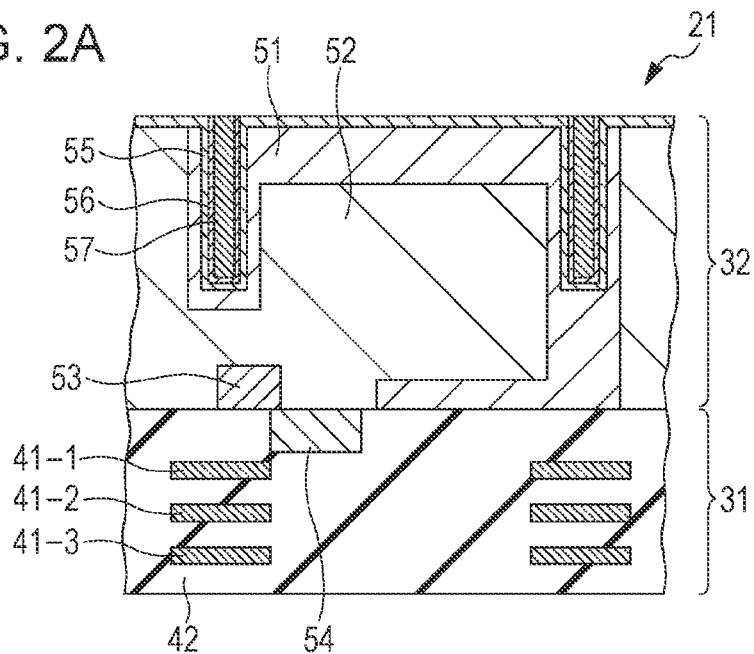
FIGS. 2A to 2C are diagrams illustrating a first configuration example of a pixel.
Figure 2B:
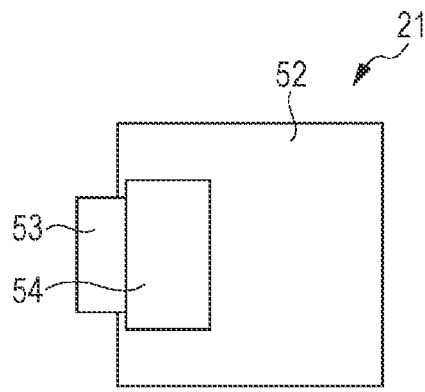
Figure 2C:
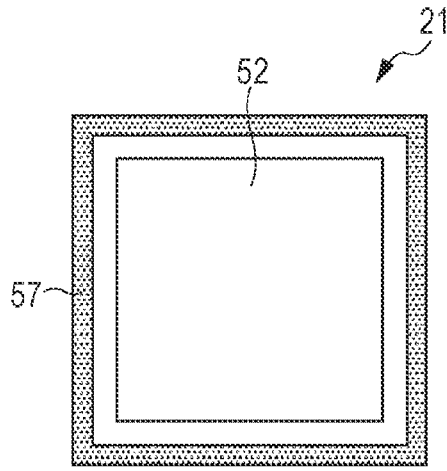

FIGS. 2A to 2C are diagrams illustrating a first configuration example of a pixel 21 included in a solid-state imaging device 11.

FIG. 2A illustrates a cross-sectional configuration example of the pixel 21 which is the first configuration example. In addition, light is incident on the pixel 21 from the top in FIG. 2A, and hereinafter, appropriately, a surface on a side on which light is incident is referred to as a light incident surface, and a surface facing the side opposite to the light incident surface is referred to as an opposite surface. Further, FIG. 2B illustrates a planar configuration example of the solid-state imaging device 11 as viewed from the opposite surface side, and FIG. 2C illustrates a planar configuration example of the solid-state imaging device 11 as viewed from the light incident surface side.

As illustrated in FIGS. 2A to 2C, the pixel 21 is configured with a wiring layer 31 and a sensor layer 32 which are laminated, and a color filter layer and an on-chip lens layer, which are not shown, are laminated on the light incident surface side of the sensor layer 32.

The wiring layer 31 includes a plurality of layers of wirings 41 formed between interlayer insulating films 42, and three layers of wirings 41-1 to 41-3 are formed in a configuration example of FIGS. 2A to 2C.

In the sensor layer 32, a PD 52 and an FD unit 53 are formed on a semiconductor substrate 51, a gate electrode 54 is laminated on the opposite surface side of the semiconductor substrate 51, a fixed charge film 55 is laminated on the light incident surface side of the semiconductor substrate 51, and an engraved light shielding electrode 57 is formed in a trench formed on the light incident surface of the semiconductor substrate 51, through the fixed charge film 55 and a barrier metal 56.

The semiconductor substrate 51 is a silicon substrate (P well) to which P-type impurities are injected. The PD 52 is formed by a PN junction formed by N-type impurities being injected to the semiconductor substrate 51, and generates charges by photoelectrically converting the received light to accumulate the generated charges.

The FD unit 53 is a dense N-type region (floating diffusion region) formed by injecting N-type impurities in the vicinity of the opposite surface of the semiconductor substrate 51, and temporarily stores the charges transferred from the PD 52. Further, the FD unit 53 is a charge detection unit that converts the charges into a voltage, and the charges stored in the FD unit 53 are converted into a voltage in an amplifying transistor (an amplifying transistor 62 in FIG. 4 which will be described later). The gate electrode 54 is an electrode constituting a gate of a transfer transistor (a transfer transistor 61 in FIG. 4 which will be described later) which transfers charges accumulated in the PD 52 to the FD unit 53.

The fixed charge film 55 is a film that holds, for example, negative fixed charges, and suppresses the generation of a dark current at a boundary surface of the semiconductor substrate 51. In addition, an insulating film may be used instead of the fixed charge film 55. The barrier metal 56 is a metal film which is formed for diffusion preventing or interaction preventing of a metal material forming the engraved light shielding electrode 57.

For example, as illustrated in FIG. 2C, the engraved light shielding electrode 57 is formed so as to surround the outer periphery of the PD 52. For example, an engraved light shielding film 55 is formed in such a manner that a trench is formed so as to surround the PD 52 on the light incident surface of the semiconductor substrate 51, the fixed charge film 55 and the barrier metal 56 are formed on the inside of the trench, and then a metal having a light shielding property is embedded in the trench.

Accordingly, the engraved light shielding electrode 57 can prevent the occurance of an optical crosstalk and an electric crosstalk with other adjacent pixels 21. In other words, the engraved light shielding electrode 57 can prevent the light incident on the pixel 21 from leaking to other pixels 21, and prevent charges generated by photoelectric conversion in the pixel 21 from leaking to other pixels 21.

Further, the vertical driving unit 13 is connected to the engraved light shielding electrode 57 through the horizontal signal line 22 of FIG. 1, and a potential of a level corresponding to the signal supplied from the vertical driving unit 13 is applied to the engraved light shielding electrode 57. For example, a negative potential is applied to the engraved light shielding electrode 57, during a charge accumulation period in which charges are accumulated in the PD 52, and during a charge transfer period in which charges are transferred from the PD 52 to the FD unit 53. Further, a negative potential is applied to the gate electrode 54 during the charge accumulation period, and a positive potential is applied to the gate electrode 54 during the charge transfer period.

An operation of a potential applied during the charge accumulation period and during the charge transfer period will be described with reference to FIGS. 3A and 3B.

Figure 3A:
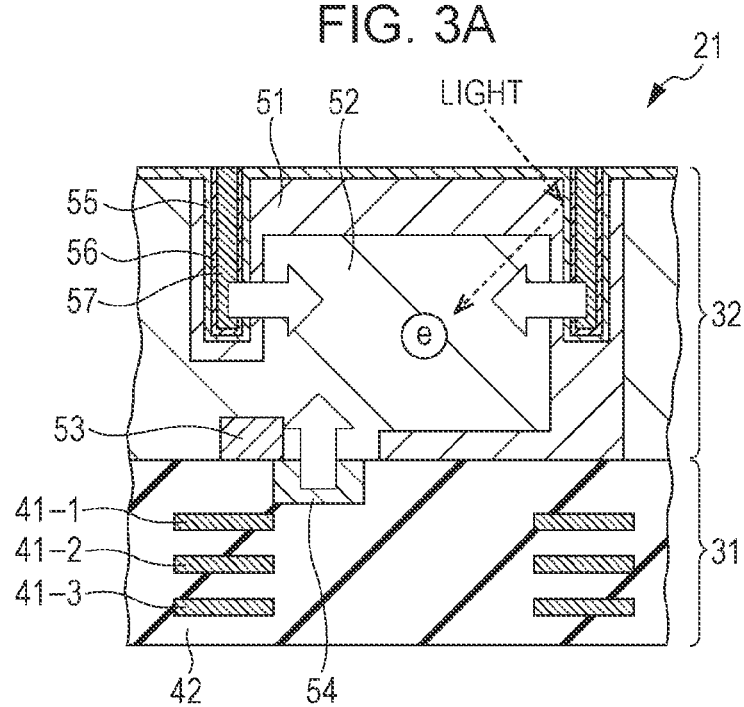
FIGS. 3A and 3B are diagrams illustrating an operation of a potential applied during a charge accumulation period and during a charge transfer period.
Figure 3B:
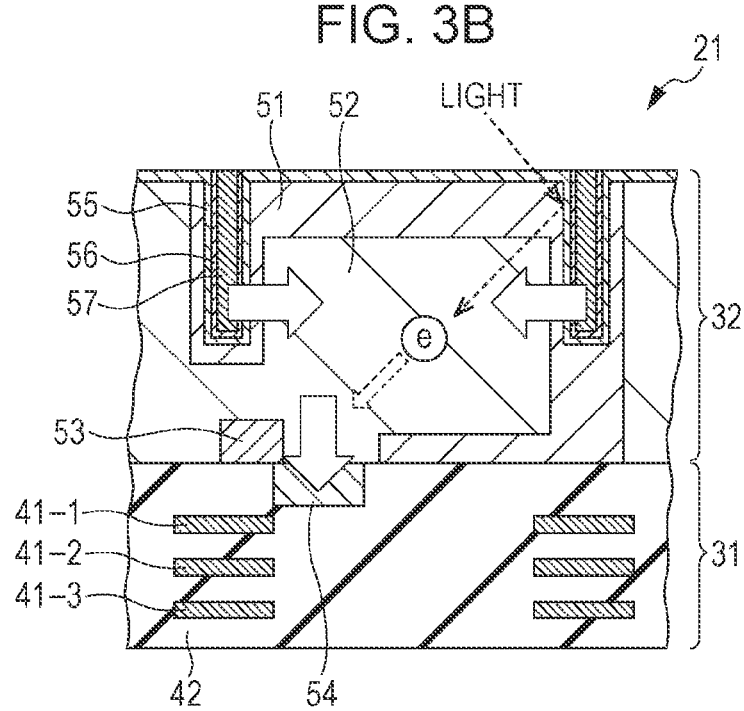

FIG. 3A illustrates the pixel 21 during the charge accumulation period, and FIG. 3B illustrates the pixel 21 during the charge transfer period. In addition, the light incident on the pixel 21 is converted into electrons e in the PD 52. Further, as illustrated in FIGS. 3A and 3B, the light incident on the pixel 21 in an oblique direction is prevented from leaking to other adjacent pixels 21 by being reflected on the engraved light shielding electrode 57.

As illustrated in FIG. 3A, in the pixel 21, a force pushing electrons e to the center of the PD 52 is generated as indicated by the hollow arrows by applying negative potentials (potentials that repel electrons e) to the gate electrode 54 and the engraved light shielding electrode 57 during the charge accumulation period. Accordingly, the pixel 21 can deepen the potential well of the PD 52 during the charge accumulation period and increase the saturation charge amount of the PD 52. Further, in the pixel 21, it is possible to suppress the generation of a dark current by applying a negative potential.

Further, during the charge transfer period, in the pixel 21, a negative potential is applied to the engraved light shielding electrode 57, whereas a positive potential (the potential of attracting electrons e) is applied to the gate electrode 54. Thus, as indicated by the hollow arrows in FIG. 3B, a force pushing electrons e to the center of the PD 52 and the gate electrode 54 is generated. Accordingly, as indicated by the hollow arrow illustrated in dashed lines in FIG. 3B, in the pixel 21, it is possible to assist the flow of the electrons e to the gate electrode 54, and to improve the transfer performance of charges from the PD 52 to the FD unit 53.

In this manner, it is possible to increase the saturation charge amount of the PD 52 and to suppress the generation of a dark current during the charge accumulation period, whereas it is possible to improve the transfer performance of charges during the charge transfer period, thereby improving the characteristics of the pixel 21. Thus, for example, it is possible to improve an S/N ratio and to reduce noise at low light conditions in the pixel 21.

Further, in the solid-state imaging device 11, the materials used in the engraved light shielding electrode 57 on the light incident surface side can be used, for example, for light shielding in an optical black region. Thus, it is possible to reduce the number of steps in the production of the solid-state imaging device 11. Further, it is possible to control the overflows of charges to other adjacent pixels 21 in the solid-state imaging device 11.

Next, a driving method of the pixel 21 will be described with reference to FIGS. 4 and 5.

Figure 4:
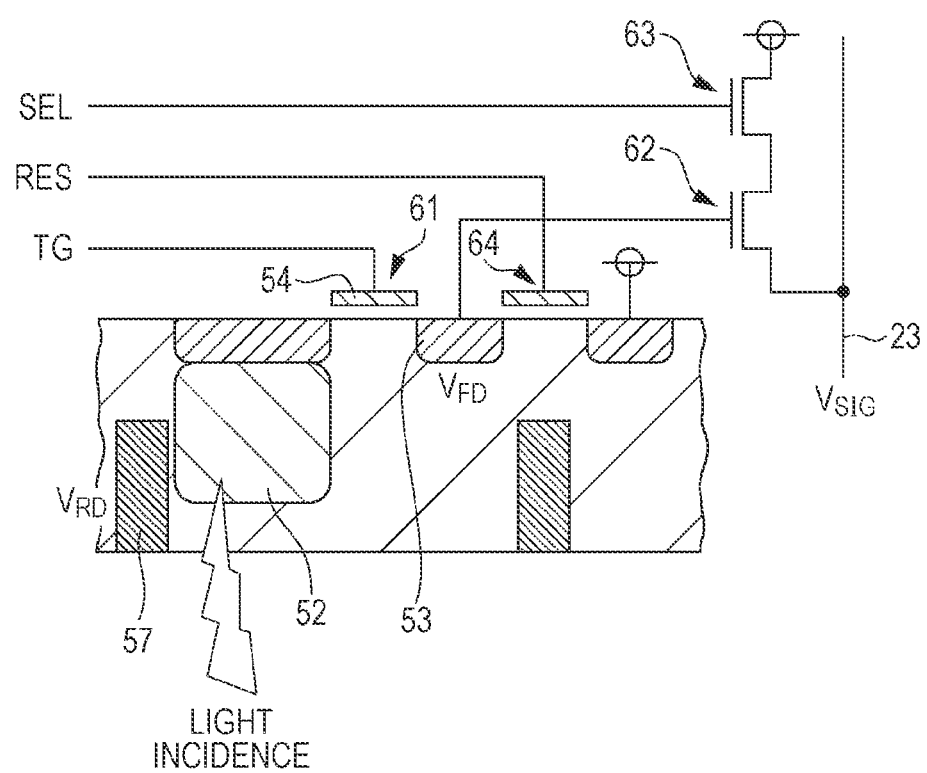
FIG. 4 is a diagram illustrating a circuit configuration of a pixel.

FIG. 4 illustrates a circuit configuration of the pixel 21. FIG. 5 illustrates a drive signal supplied to the pixel 21 and potentials of respective units in the pixel 21.

As illustrated in FIG. 4, the pixel 21 is configured to include a transfer transistor 61, an amplifying transistor 62, a selection transistor 63, and a reset transistor 64 as well as the PD 52, the FD unit 53, the gate electrode 54, and the engraved light shielding electrode 57, which are described with reference to FIGS. 2A to 2C, and is connected to the vertical signal line 23.

The transfer transistor 61 is driven according to a transfer signal TG supplied from the vertical driving unit 13 of FIG. 1, and if the transfer signal TG supplied to the gate electrode 54 of the transfer transistor 61 is at a high level, the transfer transistor 61 is turned ON. Thus, the charges accumulated in the PD 52 are transferred to the FD unit 53 through the transfer transistor 61.

The amplifying transistor 62 is an input portion of a source follower which is a reading circuit that reads signals obtained by the photoelectric conversion in the PD 52, and outputs pixel signals of a level corresponding to the charges accumulated in the FD unit 53 to the vertical signal line 23. In other words, the amplifying transistor 62 constitutes the source follower with a current source (not shown) connected to one end of the vertical signal line 23 by the drain electrode of the amplifying transistor 62 being connected to the power supply voltage through the selection transistor 63 and the source electrode thereof being connected to the vertical signal line 23.

The selection transistor 63 is driven according to a selection signal SEL supplied from the vertical driving unit 13 of FIG. 1, and if the selection signal SEL supplied to the gate electrode is at a high level, the selection transistor 63 is turned ON and the power supply voltage is connected to the amplifying transistor 62.

The reset transistor 64 is driven according to a reset signal RES supplied from the vertical driving unit 13 of FIG. 1. For example, if the reset signal RES supplied to the gate electrode is at a high level, the reset transistor 64 is turned ON, and resets the FD unit 53 by discharging the charges accumulated in the FD unit 53 to the power supply voltage.

Further, in the pixel 21, as described above with reference to FIGS. 3A and 3B, a light shielding electrode applying voltage $V_{RD}$ is supplied from the vertical driving unit 13 to the engraved light shielding electrode 57 in order to apply the potential to the engraved light shielding electrode 57.

Figure 5:
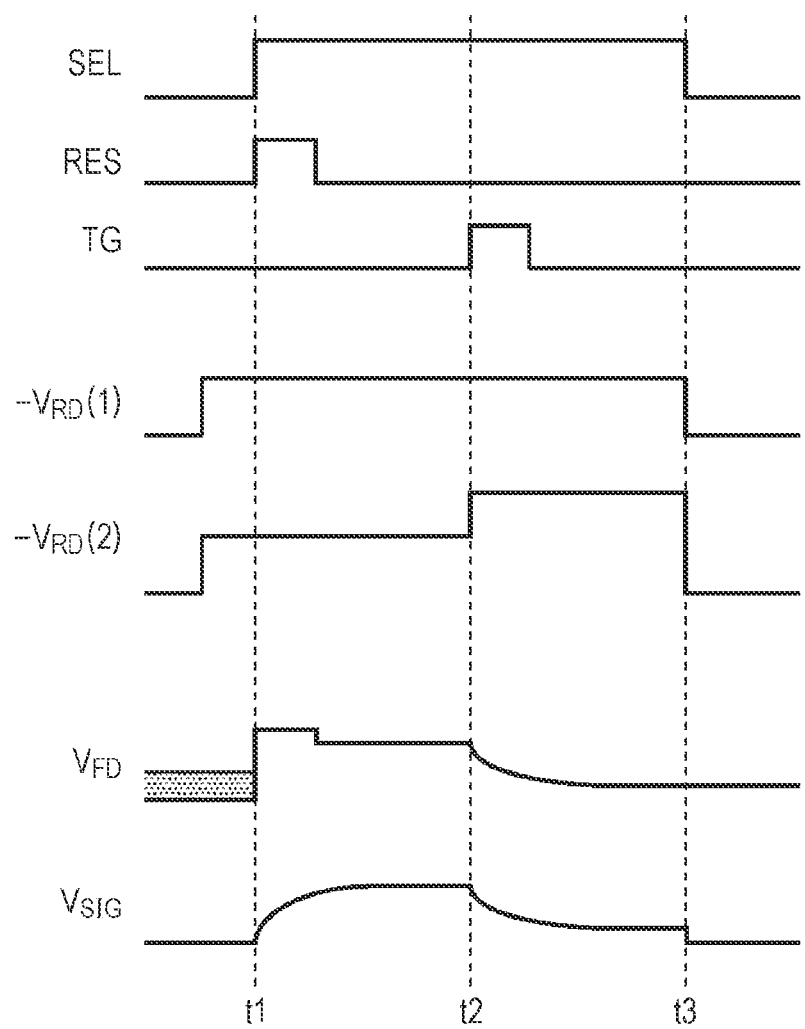
FIG. 5 is a diagram illustrating a drive signal supplied to a pixel and potentials of respective units in the pixel.

FIG. 5 illustrates, in order from the top, the selection signal SEL, the reset signal RES, the transfer signal TG, the light shielding electrode applying voltages $V_{RD}(1)$ and $V_{RD}(2)$, the potential level $V_{FD}$ of the FD unit 53, and the potential level $V_{SIG}$ of the vertical signal line 23. In addition, in FIG. 5, inverted signals (that is, $-V_{RD}(1)$ and $-V_{RD}(2)$) are illustrated as the light shielding electrode applying voltages $V_{RD}(1)$ and $V_{RD}(2)$, and when the applying voltage is at a high level, a negative potential is applied to the engraved light shielding electrode 57.

Here, it is possible to select either the light shielding electrode applying voltage $V_{RD}(1)$ or the light shielding electrode applying voltage $V_{RD}(2)$ for use in response to the operation of the pixel 21. For example, the light shielding electrode applying voltage $V_{RD}(1)$ is selected for use in a case of performing a normal expected operation, and the light shielding electrode applying voltage $V_{RD}(2)$ is selected for use in a case of performing a pinning enhancement operation and a transfer assist enhancement operation.

Further, in FIG. 5, a timing t1 is a timing at which selecting the pixel 21 as a pixel which outputs a pixel signal is started, and a timing t2 is a timing at which charge transfer from the PD 52 to the FD unit 53 is started. Further, a timing t3 is a timing at which selecting the pixel 21 as a pixel which outputs a pixel signal is terminated.

First, if the accumulation of charges of the PD 52 is started before the timing t1 at which selecting the pixel 21 is started, the light shielding electrode applying voltage $V_{RD}(1)$ is switched from the low level to the high level. Similarly, the light shielding electrode applying voltage $V_{RD}(2)$ is switched from a low level to a first high level. Thus, a negative potential is applied to the engraved light shielding electrode 57. In addition, the low level of the transfer signal TG is set to a negative potential and during a period other than the charge transfer period, a negative potential is applied to the gate electrode 54 of the transfer transistor 61 according to the transfer signal TG.

Accordingly, during a period of accumulation of charges in the PD 52, a negative potential is applied to the gate electrode 54 and the engraved light shielding electrode 57, and as illustrated in FIG. 3A, a force pushing electrons e to the center of the PD 52 is generated.

Then, at the timing t1, the selection signal SEL is at a high level such that the pixel 21 is selected; and the reset signal RES is at a high level such that the potential level $V_{FD}$ of the FD unit 53 is reset. In other words, the FD unit 53 is in a state in which charges transferred to the FD unit 53 prior to the present process are left, and the charges are discharged to the power supply voltage. As a consequence of this, the potential level $V_{SIG}$ of the vertical signal line 23 varies depending on the potential level $V_{FD}$ (that is, a reset level) of the FD unit 53. Thereafter, the reset signal RES is at a low level and the potential level $V_{FD}$ of the FD unit 53 and the potential level $V_{SIG}$ of the vertical signal line 23 are stable, and then the potential level $V_{SIG}$ of the vertical signal line 23 is read as a potential of a reset level to the column processing unit 14 of FIG. 1.

Next, at the timing t2, the transfer signal TG is at a high level such that the charges accumulated in the PD 52 are transferred to the FD unit 53. In other words, at this time, a positive potential is applied to the gate electrode 54 of the transfer transistor 61 according to the transfer signal TG. Accordingly, when charges are transferred from the PD 52, a negative potential is applied to the engraved light shielding electrode 57, whereas a positive potential is applied to the gate electrode 54, such that, as illustrated in FIG. 3B, the flow of electrons e to the gate electrode 54 is assisted.

Further, at the timing t2, the light shielding electrode applying voltage $V_{RD}(2)$ is switched from the first high level to a second high level of a higher level.

Accordingly, if the light shielding electrode applying voltage $V_{RD}(2)$ is selected for use, when charges are transferred from the PD 52, a negative potential corresponding to the second high level which is higher than the negative potential corresponding to the first high level is applied to the engraved light shielding electrode 57.

Then, if charges are transferred from the PD 52 to the FD unit 53, the potential level $V_{FD}$ of the FD unit 53 and the potential level $V_{SIG}$ of the vertical signal line 23 vary depending on the amount of charges transferred to the FD unit 53. Thereafter, the transfer signal TG is at a low level and the transfer of charges is terminated and thus the potential level $V_{FD}$ of the FD unit 53 and the potential level $V_{SIG}$ of the vertical signal line 23 are stable, and then the potential level $V_{SIG}$ of the vertical signal line 23 is read out to the column processing unit 14 of FIG. 1 as a potential of the pixel signal level.

Thereafter, at the timing t3, the selection signal SEL is at a low level and thus the selection of the pixel 21 is terminated. At this time, the light shielding electrode applying voltage $V_{RD}(1)$ is switched from a high level to a low level, and the light shielding electrode applying voltage $V_{RD}(2)$ is switched from the second high level to the low level.

Further, when the light shielding electrode applying voltage $V_{RD}(2)$ is selected as a voltage to be applied to the engraved light shielding electrode 57, during the charge transfer period, a negative potential of the second high level which is at a higher level than the first high level during the charge accumulation period is applied to the engraved light shielding electrode 57. Thus, the transfer assist of charge can be further enhanced.

Next, FIGS. 6A to 6C are diagrams illustrating a second configuration example of the pixel 21 included in the solid-state imaging device 11.

FIG. 6A illustrates a cross-sectional configuration example of the pixel 21-1 which is the second configuration example, FIG. 6B illustrates a planar configuration example of the pixel 21-1 as viewed from the opposite surface side, and FIG. 6C illustrates a planar configuration example of the pixel 21-1 as viewed from the light incident surface side.

As illustrated in FIGS. 6A to 6C, the pixel 21-1 has a different configuration from the pixel 21 of FIGS. 2A to 2C in that a planar electrode 72 is laminated through an insulating film 71 on the opposite surface side of the semiconductor substrate 51 and a transparent conductive film 74 is laminated through a barrier metal 73 on a light incident surface side of the semiconductor substrate 51.

In addition, otherwise, the pixel 21-1 has common components with the pixel 21 of FIGS. 2A to 2C, the common components are denoted by the same reference numerals and thus the detailed description thereof will be omitted. In other words, the pixel 21-1 has a configuration common to the pixel 21 of FIGS. 2A to 2C in that the PD 52 and the FD unit 53 are formed on the semiconductor substrate 51, the gate electrode 54 is laminated on the opposite surface side of the semiconductor substrate 51, the fixed charge film 55 is laminated on the light incident surface side of the semiconductor substrate 51, and the engraved light shielding electrode 57 is formed in the trench which is formed on the light incident surface of the semiconductor substrate 51, through the fixed charge film 55 and the barrier metal 56.

The insulating film 71 is a film having an insulating property and insulates a part between the semiconductor substrate 51 and the planar electrode 72. The planar electrode 72 is an electrode disposed in a plane manner with respect to the opposite surface of the sensor layer 32, and as illustrated in FIG. 6B, is configured so as to cover the entire surface of the pixel 21-1 other than a region in which the FD unit 53 and the gate electrode 54 are formed, on the opposite surface of the sensor layer 32.

The barrier metal 73 is a metal film which is formed for diffusion prevention or interaction prevention of a metal material forming the transparent conductive film 74. The transparent conductive film 74 is a film having optical transparency and electrical conductivity, and is formed so as to cover the entire surface of the pixel 21-1 in the light incident surface of the sensor layer 32.

Then, in the pixel 21-1, the vertical driving unit 13 is respectively connected to the planar electrode 72 and the transparent conductive film 74 through a horizontal signal line 22 of FIG. 1, and a potential of a level corresponding to signals supplied from the vertical driving unit 13 is applied thereto. For example, a negative potential is applied to the planar electrode 72 during the charge accumulation period, and a positive potential is applied thereto during the charge transfer period. Further, a negative potential is applied to the transparent conductive film 74, during the charge accumulation period and during the charge transfer period.

An operation of a potential applied during the charge accumulation period and during the charge transfer period will be described with reference to FIGS. 7A and 7B.

FIG. 7A illustrates the pixel 21-1 during the charge accumulation period, and FIG. 7B illustrates the pixel 21-1 during the charge transfer period. In addition, the light incident on the pixel 21-1 is converted into electrons e in the PD 52. Further, as illustrated in FIGS. 7A and 7B, the light incident on the pixel 21-1 in an oblique direction is prevented from leaking to other adjacent pixels 21 by being reflected on the engraved light shielding electrode 57.

As illustrated in FIG. 7A, in the pixel 21-1, a negative potential is applied to the gate electrode 54, the engraved light shielding electrode 57, the planar electrode 72, and the transparent conductive film 74 during the charge accumulation period. Thus, as indicated by the hollow arrows in FIG. 7A, a force pushing electrons e to the center of the PD 52 is generated. Accordingly, the pixel 21-1 can deepen the potential well of the PD 52 during the charge accumulation period and increase the saturation charge amount of the PD 52. Further, in the pixel 21-1, it is possible to suppress the generation of a dark current by applying a negative potential.

Further, during the charge transfer period, in the pixel 21-1, a negative potential is applied to the engraved light shielding electrode 57 and the transparent conductive film 74, whereas a positive potential is applied to the gate electrode 54 and the planar electrode 72. Thus, as indicated by the hollow arrows in FIG. 7B, a force pushing electrons e to the center of the PD 52 and to the opposite surface is generated. Accordingly, as indicated by the hollow arrows of a dashed line in FIG. 7B, in the pixel 21-1, it is possible to assist the flow of the electrons e to the gate electrode 54 which is located on the opposite surface, and to improve the transfer performance of charges from the PD 52 to the FD unit 53.

In this manner, it is possible to increase the saturation charge amount of the PD 52 and to suppress the generation of a dark current during the charge accumulation period, whereas it is possible to improve the transfer performance of charges during the charge transfer period, thereby improving the characteristics of the pixel 21-1.

Next, a driving method of the pixel 21-1 will be described with reference to FIGS. 8 and 9.

Figure 8:
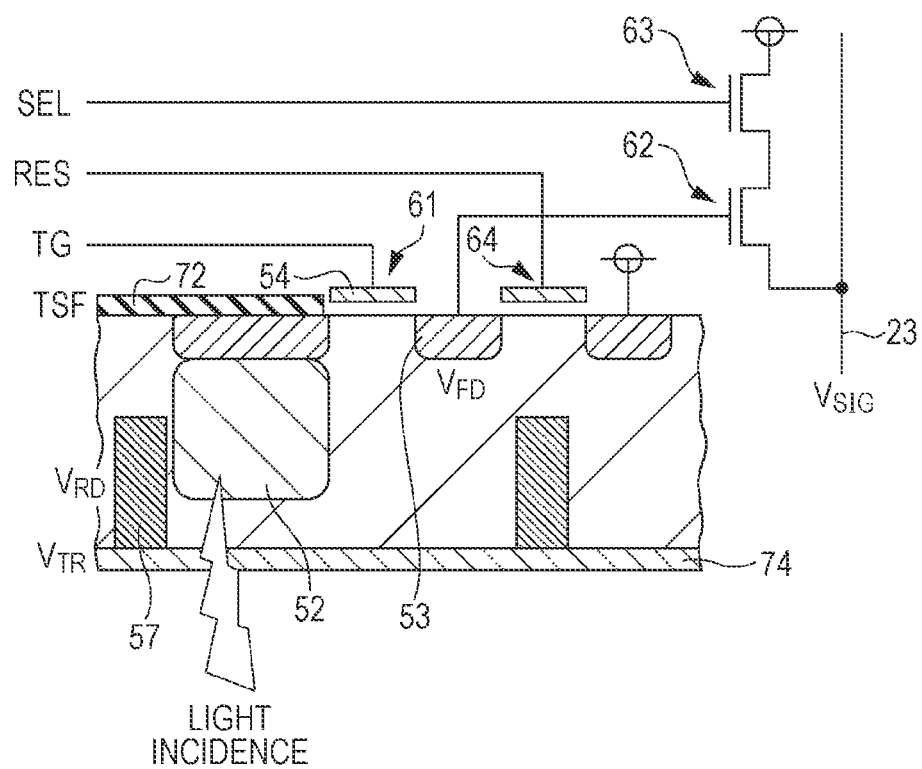
FIG. 8 is a diagram illustrating a circuit configuration of a pixel.

FIG. 8 illustrates a circuit configuration of the pixel 21-1. FIG. 9 illustrates a drive signal supplied to the pixel 21-1 and potentials of respective units in the pixel 21-1.

As illustrated in FIG. 8, the pixel 21-1 has a different configuration from the pixel 21 of FIG. 4 in that a planar electrode 72 is disposed on the opposite surface side of the sensor layer 32 and a transparent conductive film 74 is disposed on the light incident surface side of the sensor layer 32. In addition, the pixel 21-1 has common components with the pixel 21 of FIG. 4 in other parts, the common components are denoted by the same reference numerals and thus the detailed description thereof will be omitted. In other words, the pixel 21-1 is configured to include a transfer transistor 61, an amplifying transistor 62, a selection transistor 63, and a reset transistor 64, and is connected to a vertical signal line 23.

Further, in the pixel 21-1, a planar electrode applying voltage $V_{TSF}$ is supplied from the vertical driving unit 13 to the planar electrode 72 in order to apply the potentials, described with reference to FIGS. 7A and 7B, to the planar electrode 72. Similarly, in the pixel 21-1, a transparent conductive film applying voltage $V_{TR}$ is supplied from the vertical driving unit 13 to the transparent conductive film 74 in order to apply the potentials, described with reference to FIGS. 7A and 7B, to the transparent conductive film 74.

FIG. 9 illustrates, in order from the top, the selection signal SEL, the reset signal RES, the transfer signal TG, the light shielding electrode applying voltages $V_{RD}(1)$ and $V_{RD}(2)$, the transparent conductive film applying voltages $V_{TR}(1)$ and $V_{TR}(2)$, the planar electrode applying voltages $V_{TSF}(1)$ and $V_{TSF}(2)$, the potential level $V_{FD}$ of the FD unit 53, and the potential level $V_{SIG}$ of the vertical signal line 23.

Here, the light shielding electrode applying voltage $V_{RD}(1)$ and the transparent conductive film applying voltage $V_{TR}(1)$ are common, and the light shielding electrode applying voltage $V_{RD}(2)$ and the transparent conductive film applying voltage $V_{TR}(2)$ are common. Further, the light shielding electrode applying voltages $V_{RD}(1)$ and $V_{RD}(2)$ and the transparent conductive film applying voltages $V_{TR}(1)$ and $V_{TR}(2)$ are represented as inverted signals, and when the applying voltage is a high level, a negative potential is applied. In addition, the low level of the planar electrode applying voltages $V_{TSF}(1)$ and $V_{TSF}(2)$ is a negative potential, and the high level of the planar electrode applying voltages $V_{TSF}(1)$ and $V_{TSF}(2)$ is a positive potential.

Further, it is possible to select either a pair of the light shielding electrode applying voltage $V_{RD}(1)$ and transparent conductive film applying voltage $V_{TR}(1)$ or a pair of the light shielding electrode applying voltage $V_{RD}(2)$ and the transparent conductive film applying voltage $V_{TR}(2)$ for use in response to the operation of the pixel 21-1. For example, the light shielding electrode applying voltage $V_{RD}(1)$ and the transparent conductive film applying voltage $V_{TR}(1)$ are selected for use in a case of performing a normal expected operation. In contrast, the light shielding electrode applying voltage $V_{RD}(2)$ and the transparent conductive film applying voltage $V_{TR}(2)$ are selected for use in a case of performing a pinning enhancement operation and a transfer assist enhancement operation.

In the same manner, it is possible to select either the planar electrode applying voltage $V_{TSF}(1)$ or the planar electrode applying voltage $V_{TSF}(2)$ for use in response to the operation of the pixel 21-1. For example, the planar electrode applying voltage $V_{TSF}(1)$ is selected for use in a case of performing a normal expected operation, and the planar electrode applying voltage $V_{TSF}(2)$ is selected for use in a case of performing an operation of performing a transfer after causing charges to approach the vicinity of the opposite surface.

Further, in FIG. 9, a timing t1 is a timing at which selecting the pixel 21-1 as a pixel which outputs a pixel signal is started, and a timing t2 is a timing at which charge transfer from the PD 52 to the FD unit 53 is started. Further, a timing t3 is a timing at which selecting the pixel 21-1 as a pixel which outputs a pixel signal is terminated.

First, if the accumulation of charges of the PD 52 is started before the timing t1 at which selecting the pixel 21-1 is started, the light shielding electrode applying voltage $V_{RD}(1)$ and the transparent conductive film applying voltage $V_{TR}(1)$ are switched from the low level to the high level. Similarly, the light shielding electrode applying voltage $V_{RD}(2)$ and the transparent conductive film applying voltage $V_{TR}(2)$ are switched from the low level to a first high level. Thus, a negative potential is applied to the engraved light shielding electrode 57 and the transparent conductive film 74. Further, at this time, the planar electrode applying voltages $V_{TSF}(1)$ and $V_{TSF}(2)$ are at a low level, a negative potential is applied to the planar electrode 72. In addition, the low level of the transfer signal TG is set to a negative potential and during a period other than the charge transfer period, a negative potential is applied to the gate electrode 54 of the transfer transistor 61 according to the transfer signal TG.

Accordingly, during a period of accumulation of charges in the PD 52, a negative potential is applied to the gate electrode 54, the engraved light shielding electrode 57, the transparent conductive film 74, and the planar electrode 72, and as illustrated in FIG. 7A, a force pushing electrons e to the center of the PD 52 is generated.

Then, at the timing t1, the selection signal SEL is at a high level such that the pixel 21-1 is selected; and the reset signal RES is at a high level such that the potential level $V_{FD}$ of the FD unit 53 is reset. In other words, the FD unit 53 is in a state in which charges transferred to the FD unit 53 prior to the present process are left, and the charges are discharged to the power supply voltage. As a consequence of this, the potential level $V_{SIG}$ of the vertical signal line 23 varies depending on the potential level $V_{FD}$ (that is, a reset level) of the FD unit 53. Thereafter, the reset signal RES is at a low level and the potential level $V_{FD}$ of the FD unit 53 and the potential level $V_{SIG}$ of the vertical signal line 23 are stable, and then the potential level $V_{SIG}$ of the vertical signal line 23 is read as a potential of a reset level to the column processing unit 14 of FIG. 1.

Next, at the timing t2, the transfer signal TG is at a high level such that the charges accumulated in the PD 52 are transferred to the FD unit 53. In other words, at this time, a positive potential is applied to the gate electrode 54 of the transfer transistor 61 according to the transfer signal TG. Further, simultaneously with the transfer signal TG, the planar electrode applying voltage $V_{TSF}(1)$ is at a high level such that a positive potential is applied to the planar electrode 72 according to the planar electrode applying voltage $V_{TSF}(1)$.

Accordingly, when charges are transferred from the PD 52, a negative potential is applied to the engraved light shielding electrode 57 and the transparent conductive film 74, whereas a positive potential is applied to the gate electrode 54 and the planar electrode 72, such that as illustrated in FIG. 7B, the flow of electrons e to the gate electrode 54 is assisted.

Further, at the timing t2, the light shielding electrode applying voltage $V_{RD}(2)$ and the transparent conductive film applying voltage $V_{TR}(2)$ are switched from the first high level to a second high level of a higher level. Accordingly, if the light shielding electrode applying voltage $V_{RD}(2)$ and the transparent conductive film applying voltage $V_{TR}(2)$ are selected for use, when charges are transferred from the PD 52, a negative potential corresponding to the second high level which is higher than the negative potential corresponding to the first high level is applied to the engraved light shielding electrode 57 and the transparent conductive film 74.

Then, if charges are transferred from the PD 52 to the FD unit 53, the potential level $V_{FD}$ of the FD unit 53 and the potential level $V_{SIG}$ of the vertical signal line 23 vary depending on the amount of charges transferred to the FD unit 53. Thereafter, the transfer signal TG and the planar electrode applying voltage $V_{TSF}(1)$ are at a low level such that the transfer of charges is terminated and thus the potential level $V_{FD}$ of the FD unit 53 and the potential level $V_{SIG}$ of the vertical signal line 23 are stable, and then the potential level $V_{SIG}$ of the vertical signal line 23 is read out to the column processing unit 14 of FIG. 1 as a potential of the pixel signal level.

Here, the planar electrode applying voltage $V_{TSF}(2)$ is at a high level at a predetermined timing later than the planar electrode applying voltage $V_{TSF}(1)$. In other words, when the planar electrode applying voltage $V_{TSF}(2)$ is selected for use, a positive potential is applied to the planar electrode 72 at a timing later than a timing at which a positive potential is applied to the gate electrode 54. Thus, for example, when charges are transferred from the PD 52 to the FD unit 53, electrons e are drawn to the opposite surface side of the semiconductor substrate 51 after the flow of electrons e to the gate electrode 54 is formed, such that the leakage of electrons e along the opposite surface of the semiconductor substrate 51 is prevented.

Thereafter, at the timing t3, the selection signal SEL is at a low level and thus the selection of the pixel 21-1 is terminated. At this time, the light shielding electrode applying voltage $V_{RD}(1)$ and the transparent conductive film applying voltage $V_{TR}(1)$ are switched from a high level to a low level. In the same manner, the light shielding electrode applying voltage $V_{RD}(2)$ and the transparent conductive film applying voltage $V_{TR}(2)$ are switched from the second high level to the low level.

Figure 10A:
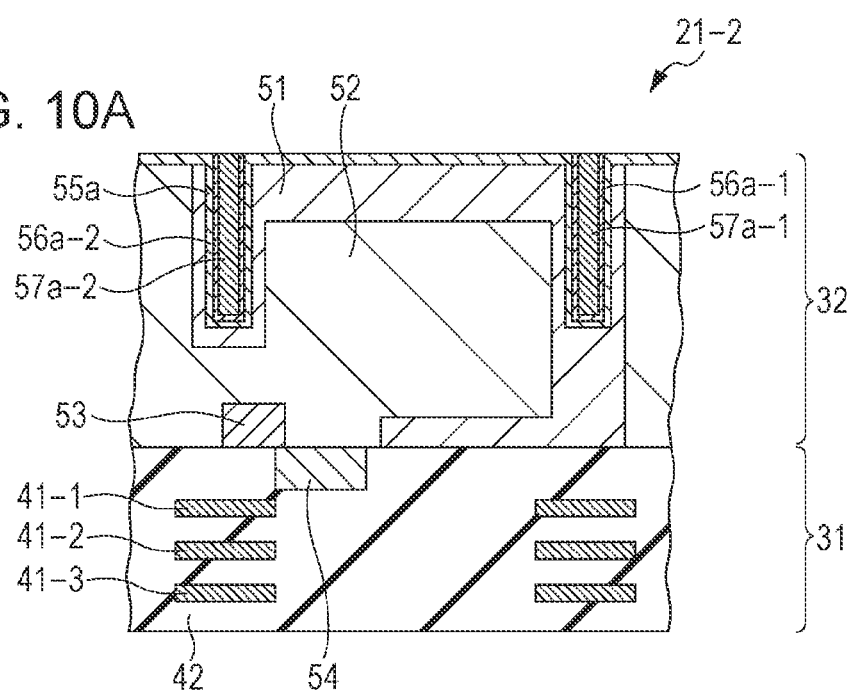
FIGS. 10A to 10C are diagrams illustrating a third configuration example of a pixel.
Figure 10B:
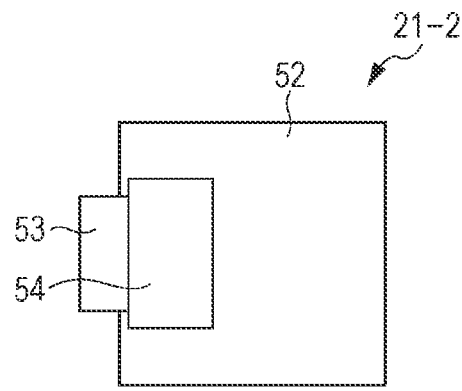
Figure 10C:
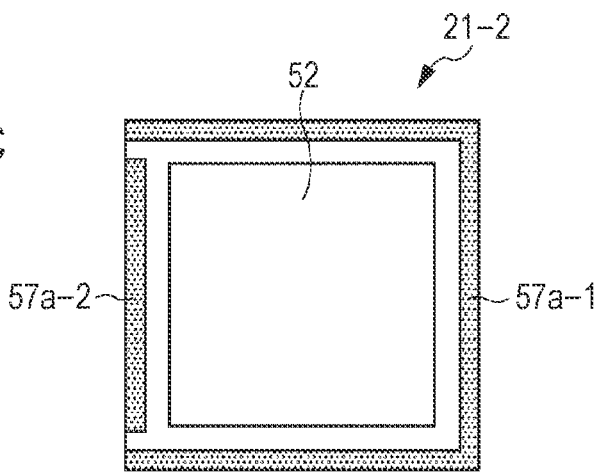

Next, FIGS. 10A to 10C are diagrams illustrating a third configuration example of the pixel 21 included in the solid-state imaging device 11.

FIG. 10A illustrates a cross-sectional configuration example of the pixel 21-2 which is the third configuration example, FIG. 10B illustrates a planar configuration example of the pixel 21-2 as viewed from the opposite surface side, and FIG. 10C illustrates a planar configuration example of the pixel 21-2 as viewed from the light incident surface side.

As illustrated in FIGS. 10A to 10C, the pixel 21-2 has a different configuration from the pixel 21 of FIGS. 2A to 2C in that the engraved light shielding electrode 57 is divided into the engraved light shielding electrodes 57a-1 and 57a-2. In addition, otherwise, the pixel 21-2 has common components with the pixel 21 of FIGS. 2A to 2C, the common components are denoted by the same reference numerals and thus the detailed description thereof will be omitted. In other words, the pixel 21-2 has a configuration common to the pixel 21 of FIGS. 2A to 2C in that the PD 52 and the FD unit 53 are formed on the semiconductor substrate 51 and the gate electrode 54 is laminated on the opposite surface side of the semiconductor substrate 51.

As illustrated in FIG. 10C, the engraved light shielding electrode 57a-1 is formed to surround the three side surfaces of the PD 52, that is, to surround the side surfaces of the PD 52 other than the side surface on the side on which the FD unit 53 and the gate electrode 54 are formed. Further, the engraved light shielding electrode 57a-2 is formed along the side surface of the PD 52 on the side in which the FD unit 53 and the gate electrode 54 are formed.

In other words, in the pixel 21-2, a first trench is formed along three side surfaces other than the side surface of the PD 52 on the side in which the FD unit 53 and the gate electrode 54 are formed, from the light incident surface of the semiconductor substrate 51, and a second trench is formed along the side surface of the PD 52 on the side in which the FD unit 53 and the gate electrode 54 are formed. Then, the engraved light shielding electrode 57a-1 is formed in the first trench through the fixed charge film 55a and the barrier metal 56a-1, and the engraved light shielding electrode 57a-2 is formed in the second trench through the fixed charge film 55a and the barrier metal 56a-2.

Then, in the pixel 21-2, the vertical driving unit 13 is connected to the engraved light shielding electrodes 57a-1 and 57a-2 through the horizontal signal line 22 of FIG. 1, and a potential of a level corresponding to signals supplied from the vertical driving unit 13 is applied thereto. For example, a negative potential is applied to the engraved light shielding electrode 57a-1 during the charge accumulation period and during the charge transfer period. Further, a negative potential is applied to the engraved light shielding electrode 57a-2 during the charge accumulation period, and a positive potential is applied to the engraved light shielding electrode 57a-2 during the charge transfer period.

An operation of a potential applied during the charge accumulation period and during the charge transfer period will be described with reference to FIGS. 11A and 11B.

FIG. 11A illustrates the pixel 21-2 during the charge accumulation period, and FIG. 11B illustrates the pixel 21-2 during the charge transfer period. In addition, the light incident on the pixel 21-2 is converted into electrons e in the PD 52. Further, as illustrated in FIGS. 11A and 11B, the light incident on the pixel 21-2 in an oblique direction is prevented from leaking to other adjacent pixels 21 by being reflected on the engraved light shielding electrode 57.

As illustrated in FIG. 11A, in the pixel 21-2, a negative potential is applied to the gate electrode 54, the engraved light shielding electrode 57a-1, and the engraved light shielding electrode 57a-2 during the charge accumulation period. Thus, as indicated by the hollow arrows in FIG. 11A, a force pushing electrons e to the center of the PD 52 is generated. Accordingly, the pixel 21-2 can deepen the potential well of the PD 52 during the charge accumulation period and increase the saturation charge amount of the PD 52. Further, in the pixel 21-2, it is possible to suppress the generation of a dark current by applying a negative potential.

Further, during the charge transfer period, in the pixel 21-2, a negative potential is applied to the engraved light shielding electrode 57a-1, whereas a positive potential is applied to the gate electrode 54 and the engraved light shielding electrode 57a-2. Thus, as indicated by the hollow arrows in FIG. 11B, a force pushing electrons e to a side surface on the engraved light shielding electrode 57a-2 side and the gate electrode 54 is generated. Accordingly, as indicated by the hollow arrows of a dashed line in FIG. 11B, in the pixel 21-2, it is possible to assist the flow of the electrons e to the gate electrode 54 which is located on the engraved light shielding electrode 57a-2 side, and to improve the transfer performance of charges from the PD 52 to the FD unit 53.

In addition, during the charge transfer period, 0 V may be applied to the engraved light shielding electrode 57a-2. Even in this case, the flow of electrons e to the engraved light shielding electrode 57a-2 side is assisted by the negative potential applied to the engraved light shielding electrode 57a-1.

In this manner, it is possible to increase the saturation charge amount of the PD 52 and to suppress the generation of a dark current during the charge accumulation period, whereas it is possible to improve the transfer performance of charges during the charge transfer period, thereby improving the characteristics of the pixel 21-2.

Next, a driving method of the pixel 21-2 will be described with reference to FIGS. 12 and 13.

Figure 12:
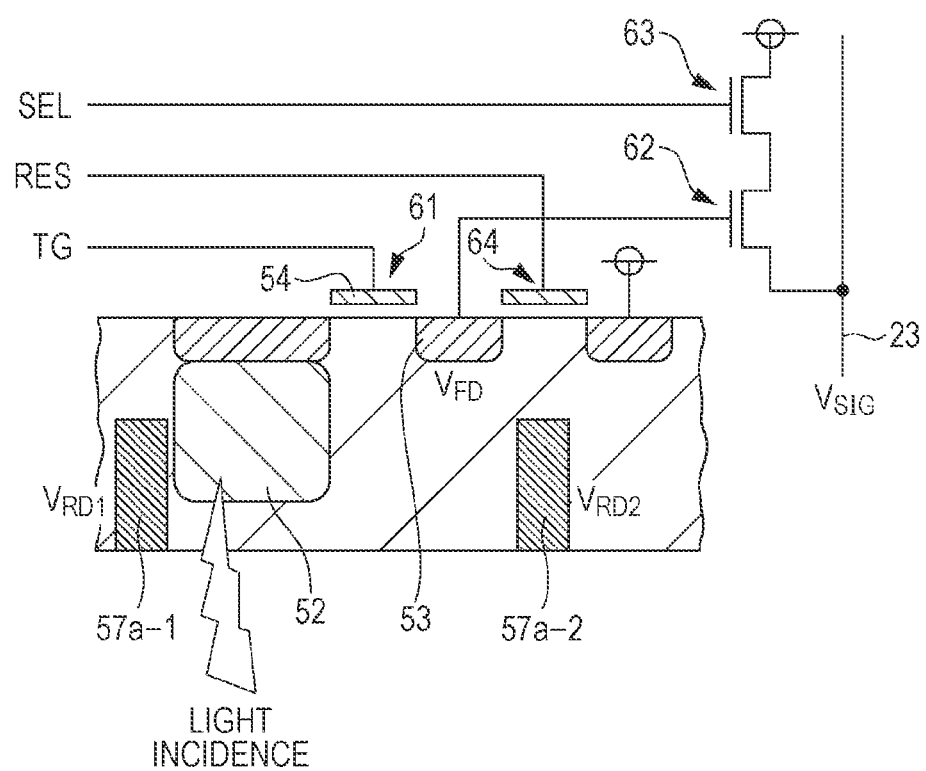
FIG. 12 is a diagram illustrating a circuit configuration of a pixel.

FIG. 12 illustrates a circuit configuration of the pixel 21-2. FIG. 13 illustrates a drive signal supplied to the pixel 21-2 and potentials of respective units in the pixel 21-2.

As illustrated in FIG. 12, the pixel 21-2 has a different configuration from the pixel 21 of FIG. 4 in that an engraved light shielding electrode 57a-2 is disposed on the FD unit 53 side of the PD 52, and an engraved light shielding electrode 57a-1 is disposed on the opposite side thereto. In addition, the pixel 21-2 has common components with the pixel 21 of FIG. 4 in other parts, the common components are denoted by the same reference numerals and thus the detailed description thereof will be omitted. In other words, the pixel 21-2 is configured to include a transfer transistor 61, an amplifying transistor 62, a selection transistor 63, and a reset transistor 64, and is connected to a vertical signal line 23.

Further, in the pixel 21-2, light shielding electrode applying voltages $V_{RD1}$ and $V_{RD2}$ are respectively supplied from the vertical driving unit 13 to the engraved light shielding electrodes 57a-1 and 57a-2 in order to apply the potentials described above with reference to FIGS. 11A and 11B to the engraved light shielding electrodes 57a-1 and 57a-2.

Figure 13:
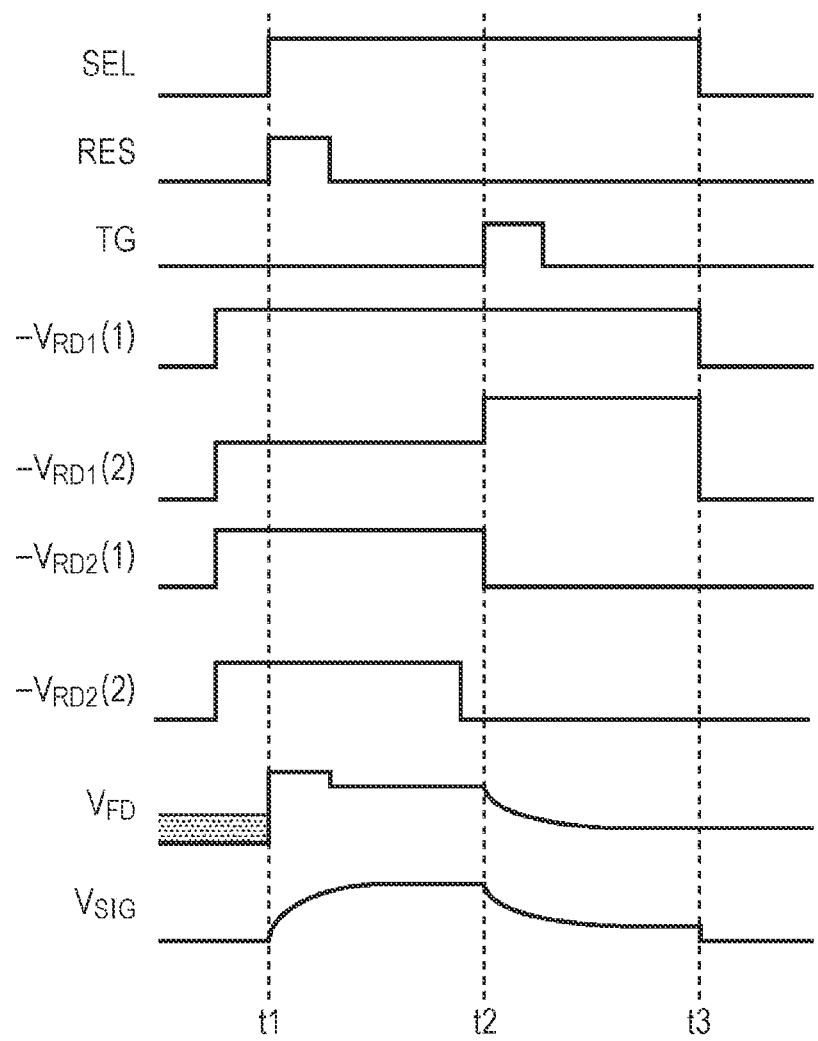
FIG. 13 is a diagram illustrating a drive signal supplied to a pixel and potentials of respective units in the pixel.

FIG. 13 illustrates, in order from the top, the selection signal SEL, the reset signal RES, the transfer signal TG, the light shielding electrode applying voltages $V_{RD1}(1)$ and $V_{RD1}(2)$, the light shielding electrode applying voltages $V_{RD2}(1)$ and $V_{RD2}(2)$, the potential level $V_{FD}$ of the FD unit 53, and the potential level $V_{SIG}$ of the vertical signal line 23.

Here, it is possible to select either the light shielding electrode applying voltage $V_{RD1}(1)$ or the light shielding electrode applying voltage $V_{RD1}(2)$ for use in response to the operation of the pixel 21-2. For example, the light shielding electrode applying voltage $V_{RD1}(1)$ is selected for use in a case of performing a normal expected operation. In contrast, the light shielding electrode applying voltage $V_{RD1}(2)$ is selected for use in a case of performing a pinning enhancement operation and a transfer assist enhancement operation. In the same manner, it is possible to select either the light shielding electrode applying voltage $V_{RD2}(1)$ or the light shielding electrode applying voltage $V_{RD2}(2)$ for use in response to the operation of the pixel 21-2. For example, the light shielding electrode applying voltage $V_{RD2}(1)$ is selected for use in a case of performing a normal expected operation. In contrast, the light shielding electrode applying voltage $V_{RD2}(2)$ is selected for use in a case of performing a transfer assist operation of approaching the vicinity of the FD unit 53 once.

Further, in FIG. 13, a timing t1 is a timing at which selecting the pixel 21-2 as a pixel which outputs a pixel signal is started, and a timing t2 is a timing at which charge transfer from the PD 52 to the FD unit 53 is started. Further, a timing t3 is a timing at which selecting the pixel 21-2 as a pixel which outputs a pixel signal is terminated.

First, if the accumulation of charges of the PD 52 is started before the timing t1 at which selecting the pixel 21-2 is started, the light shielding electrode applying voltage $V_{RD1}(1)$ is switched from the low level to the high level, and the light shielding electrode applying voltage $V_{RD1}(2)$ is switched from the low level to the first high level. Further, similarly, the light shielding electrode applying voltages $V_{RD2}(1)$ and $V_{RD2}(2)$ are switched from the low level to the high level. Thus, a negative potential is applied to the engraved light shielding electrodes 57a-1 and 57a-2. In addition, the low level of the transfer signal TG is set to a negative potential and during a period other than the charge transfer period, a negative potential is applied to the gate electrode 54 of the transfer transistor 61 according to the transfer signal TG.

Accordingly, during a period of accumulation of charges in the PD 52, a negative potential is applied to the gate electrode 54 and the engraved light shielding electrodes 57a-1 and 57a-2, and as illustrated in FIG. 11A, a force pushing electrons e to the center of the PD 52 is generated.

Then, at the timing t1, the selection signal SEL is at a high level such that the pixel 21-2 is selected; and the reset signal RES is at a high level such that the potential level $V_{FD}$ of the FD unit 53 is reset. In other words, the FD unit 53 is in a state in which charges transferred to the FD unit 53 prior to the present process are left, and the charges are discharged to the power supply voltage. As a consequence of this, the potential level $V_{SIG}$ of the vertical signal line 23 varies depending on the potential level $V_{FD}$ (that is, a reset level) of the FD unit 53. Thereafter, the reset signal RES is at a low level and the potential level $V_{FD}$ of the FD unit 53 and the potential level $V_{SIG}$ of the vertical signal line 23 are stable, and then the potential level $V_{SIG}$ of the vertical signal line 23 is read as a potential of a reset level to the column processing unit 14 of FIG. 1.

Next, at the timing t2, the transfer signal TG is at a high level such that the charges accumulated in the PD 52 are transferred to the FD unit 53. In other words, at this time, a positive potential is applied to the gate electrode 54 of the transfer transistor 61 according to the transfer signal TG. Further, simultaneously with the transfer signal TG, the light shielding electrode applying voltage $V_{RD2}(1)$ is at a low level such that a positive potential is applied to the engraved light shielding electrode 57a-2 according to the light shielding electrode applying voltage $V_{RD2}(1)$.

Accordingly, when charges are transferred from the PD 52, a negative potential is applied to the engraved light shielding electrode 57a-1, whereas a positive potential is applied to the gate electrode 54 and the engraved light shielding electrode 57a-2, such that as illustrated in FIG. 11B, the flow of electrons e to the gate electrode 54 located on the engraved light shielding electrode 57a-2 side is assisted.

Further, at the timing t2, the light shielding electrode applying voltage $V_{RD1}(2)$ is switched from the first high level to a second high level of a higher level. Accordingly, if the light shielding electrode applying voltage $V_{RD1}(2)$ is selected for use, when charges are transferred from the PD 52, a negative potential corresponding to the second high level which is higher than the negative potential corresponding to the first high level is applied to the engraved light shielding electrode 57a-1.

In addition, the light shielding electrode applying voltage $V_{RD2}(2)$ is at a low level at a predetermined timing before the timing t2, and a positive potential is applied to the engraved light shielding electrode 57a-2. Thus, prior to the charge transfer, an assist of causing electrons e to approach the vicinity of the FD unit 53 is performed first.

Then, if charges are transferred from the PD 52 to the FD unit 53, the potential level $V_{FD}$ of the FD unit 53 and the potential level $V_{SIG}$ of the vertical signal line 23 vary depending on the amount of charges transferred to the FD unit 53. Thereafter, the transfer signal TG is at a low level and the transfer of charges is terminated and the potential level $V_{FD}$ of the FD unit 53 and the potential level $V_{SIG}$ of the vertical signal line 23 are stable, and then the potential level $V_{SIG}$ of the vertical signal line 23 is read out to the column processing unit 14 of FIG. 1 as a potential of the pixel signal level.

Thereafter, at the timing t3, the selection signal SEL is at a low level and thus the selection of the pixel 21-2 is terminated. At this time, the light shielding electrode applying voltage $V_{RD1}(1)$ is switched from a high level to a low level, and the light shielding electrode applying voltage $V_{RD1}(2)$ is switched from the second high level to the low level.

Figure 14A:
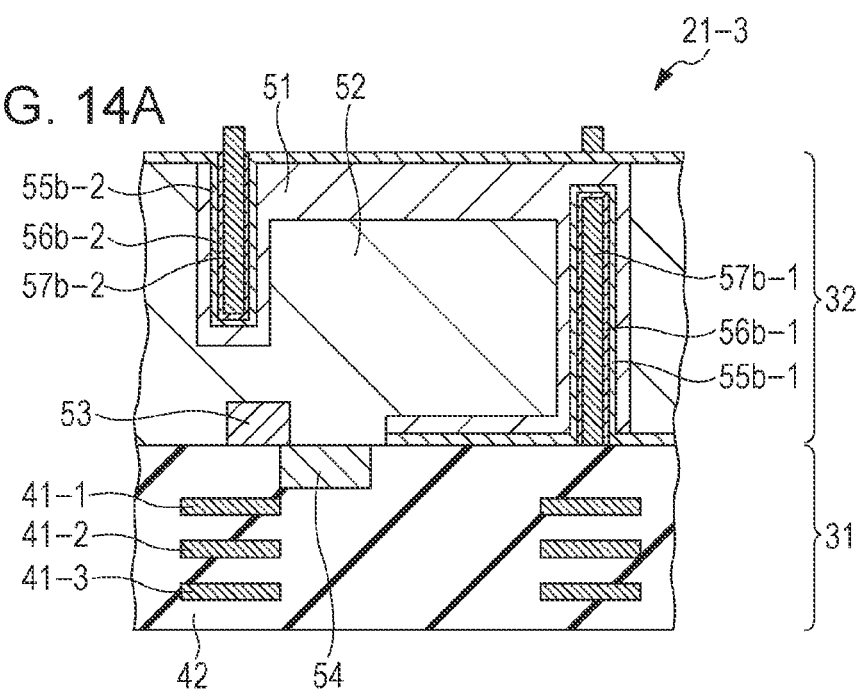
FIGS. 14A to 14C are diagrams illustrating a fourth configuration example of a pixel.
Figure 14B:
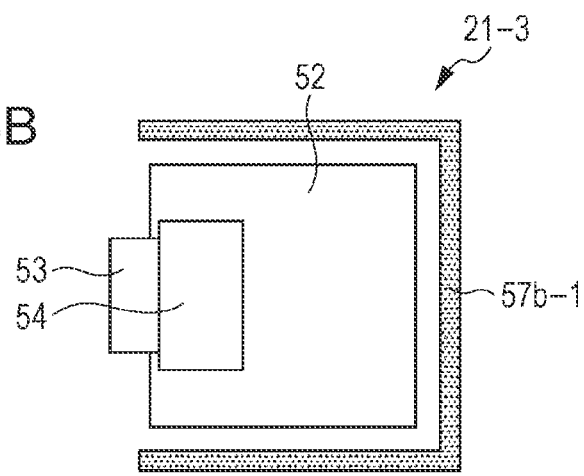
Figure 14C:
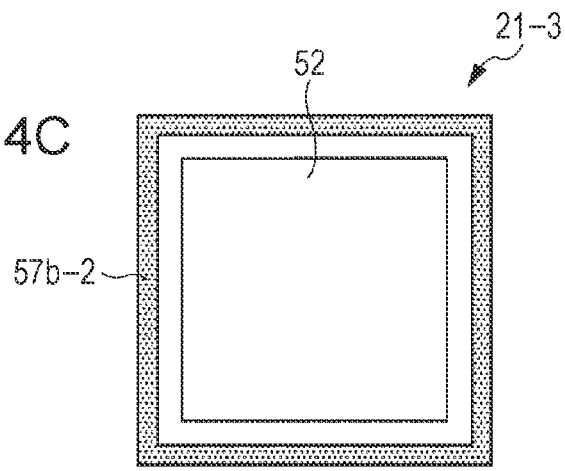

Next, FIGS. 14A to 14C are diagrams illustrating a fourth configuration example of the pixel 21 included in the solid-state imaging device 11.

FIG. 14A illustrates a cross-sectional configuration example of the pixel 21-3 which is the fourth configuration example, FIG. 14B illustrates a planar configuration example of the pixel 21-3 as viewed from the opposite surface side, and FIG. 14C illustrates a planar configuration example of the pixel 21-3 as viewed from the light incident surface side.

As illustrated in FIGS. 14A to 14C, the pixel 21-3 has a different configuration from the pixel 21 of FIGS. 2A to 2C in that the engraved light shielding electrode 57 is divided into the engraved light shielding electrodes 57b-1 and 57b-2. In addition, otherwise, the pixel 21-3 has common components with the pixel 21 of FIGS. 2A to 2C, the common components are denoted by the same reference numerals and thus the detailed description thereof will be omitted. In other words, the pixel 21-3 has a configuration common to the pixel 21 of FIGS. 2A to 2C in that a PD 52 and an FD unit 53 are formed on the semiconductor substrate 51 and a gate electrode 54 is laminated on an opposite surface side of the semiconductor substrate 51.

As illustrated in FIG. 14A, in the pixel 21-3, the engraved light shielding electrode 57b-2 is formed in a trench formed on the light incident surface side of the semiconductor substrate 51, whereas the engraved light shielding electrode 57b-1 is formed in a trench formed on the opposite surface side of the semiconductor substrate 51. Then, as illustrated in FIG. 14B, the engraved light shielding electrode 57b-1 is formed to surround the three side surfaces of the PD 52, that is, to surround the side surfaces of the PD 52 other than the side surface on the side in which the FD unit 53 and the gate electrode 54 are formed. Further, the engraved light shielding electrode 57b-2 is formed along the side surface of the PD 52 on the side in which the FD unit 53 and the gate electrode 54 are formed, and as illustrated in FIG. 14C, is formed to surround the PD 52 while being laminated on the light incident surface of the semiconductor substrate 51.

In other words, in the pixel 21-3, a first trench is formed along three side surfaces other than the side surface of the PD 52 on the side in which the FD unit 53 and the gate electrode 54 are formed, from the opposite surface of the semiconductor substrate 51. Then, the engraved light shielding electrode 57b-1 is formed in the first trench through the fixed charge film 55b-1 and the barrier metal 56b-1.

In other words, in the pixel 21-3, a second trench is formed along the side surface of the PD 52 on the side in which the FD unit 53 and the gate electrode 54 are formed, from the light incident surface of the semiconductor substrate 51. Then, the engraved light shielding electrode 57b-2 is formed in the second trench through the fixed charge film 55b-2 and the barrier metal 56b-2, and the engraved light shielding electrode 57b-2 is formed to surround the PD 52 on the light incident surface of the semiconductor substrate 51 through the fixed charge film 55b-2.

Then, in the pixel 21-3, the vertical driving unit 13 is connected to the engraved light shielding electrodes 57b-1 and 57b-2 through the horizontal signal line 22 of FIG. 1, and a potential of a level corresponding to signals supplied from the vertical driving unit 13 is applied thereto. For example, a negative potential is applied to the engraved light shielding electrode 57b-1 during the charge accumulation period and during the charge transfer period. Further, a negative potential is applied to the engraved light shielding electrode 57a-2 during the charge accumulation period, and 0 V is applied to the engraved light shielding electrode 57a-2 during the charge transfer period.

An operation of a potential applied during the charge accumulation period and during the charge transfer period will be described with reference to FIGS. 15A and 15B.

Figure 15A:
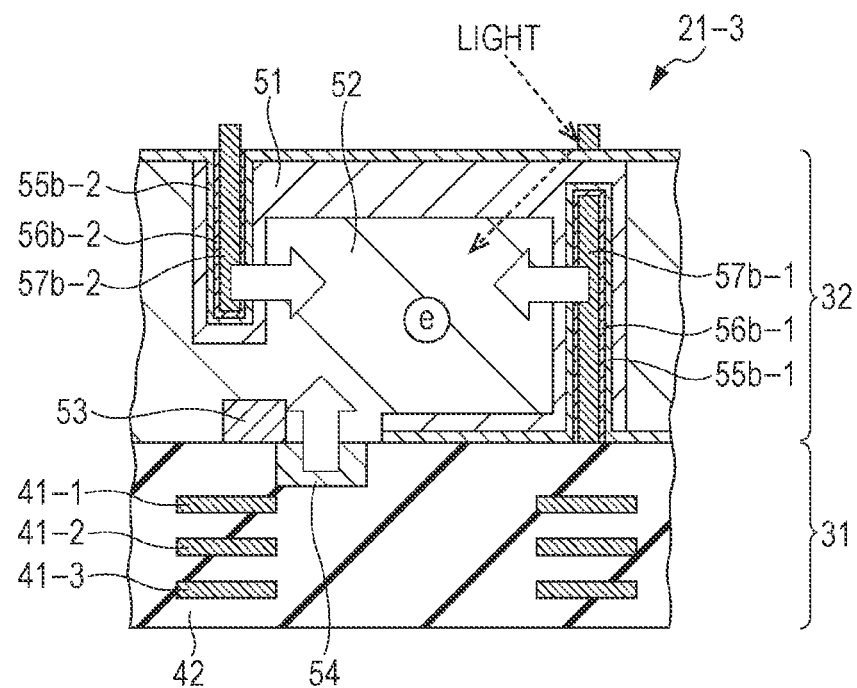
FIGS. 15A and 15B are diagrams illustrating an operation of a potential applied during a charge accumulation period and during a charge transfer period.
Figure 15B:
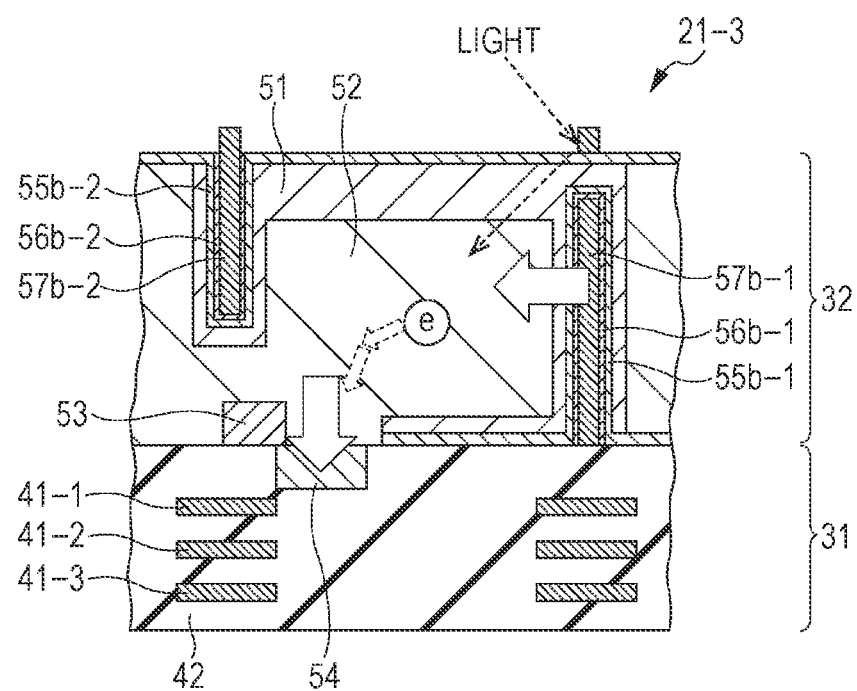

FIG. 15A illustrates the pixel 21-3 during the charge accumulation period, and FIG. 15B illustrates the pixel 21-3 during the charge transfer period. In addition, the light incident on the pixel 21-3 is converted into electrons e in the PD 52. Further, as illustrated in FIGS. 15A and 15B, the light incident on the pixel 21-3 in an oblique direction is prevented from leaking to other adjacent pixels 21 by being reflected on the engraved light shielding electrode 57.

As illustrated in FIG. 15A, in the pixel 21-3, a negative potential is applied to the gate electrode 54, the engraved light shielding electrode 57b-1, and the engraved light shielding electrode 57b-2 during the charge accumulation period. Thus, as indicated by the hollow arrows in FIG. 15A, a force pushing electrons e to the center of the PD 52 is generated. Accordingly, the pixel 21-3 can deepen the potential well of the PD 52 during the charge accumulation period and increase the saturation charge amount of the PD 52. Further, in the pixel 21-3, it is possible to suppress the generation of a dark current by applying a negative potential.

Further, during the charge transfer period, in the pixel 21-3, a negative potential is applied to the engraved light shielding electrode 57b-1, whereas a positive potential is applied to the gate electrode 54, and 0 V is applied to the engraved light shielding electrode 57b-2. Thus, as indicated by the hollow arrows in FIG. 15B, a force pushing electrons e from the engraved light shielding electrode 57b-1 to the engraved light shielding electrode 57b-2 and the gate electrode 54 is generated. Accordingly, as indicated by the hollow arrows of a dashed line in FIG. 15B, in the pixel 21-3, it is possible to assist the flow of the electrons e to the gate electrode 54 which is located on the engraved light shielding electrode 57a-2 side, and to improve the transfer performance of charges from the PD 52 to the FD unit 53.

In addition, a positive potential may be applied to the engraved light shielding electrode 57b-2 during the charge transfer period. Even in this case, the flow of electrons e to the engraved light shielding electrode 57a-2 side is assisted by the positive potential applied to the engraved light shielding electrode 57b-2. Further, when the engraved light shielding electrode 57b-2 is located in the vicinity of the gate electrode 54, the flow of electrons e to the gate electrode 54 is assisted by applying the negative potential to the engraved light shielding electrode 57b-2 during the charge transfer period.

In this manner, it is possible to increase the saturation charge amount of the PD 52 and to suppress the generation of a dark current during the charge accumulation period, whereas it is possible to improve the transfer performance of charges during the charge transfer period, thereby improving the characteristics of the pixel 21-3.

Next, a driving method of the pixel 21-3 will be described with reference to FIGS. 16 and 17.

Figure 16:
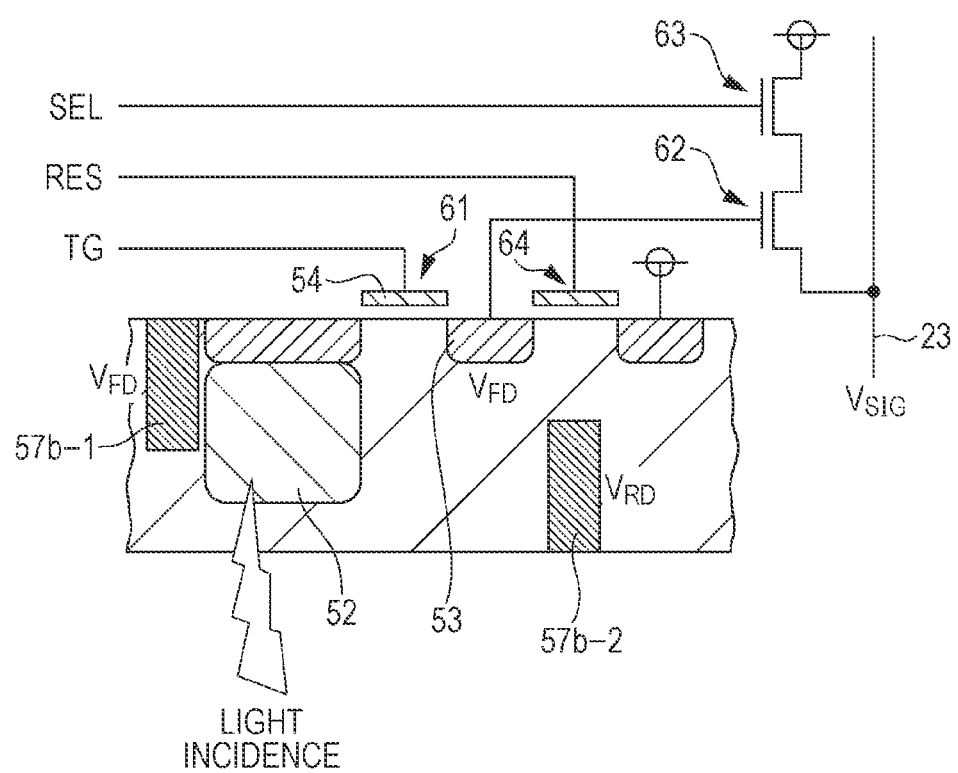
FIG. 16 is a diagram illustrating a circuit configuration of a pixel.

FIG. 16 illustrates a circuit configuration of the pixel 21-3. FIG. 17 illustrates a drive signal supplied to the pixel 21-3 and potentials of respective units in the pixel 21-3.

As illustrated in FIG. 16, the pixel 21-3 has a different configuration from the pixel 21 of FIG. 4 in that an engraved light shielding electrode 57b-2 is disposed on the light incident surface side of the FD unit 53 side of the PD 52, and an engraved light shielding electrode 57b-1 is disposed on the opposite surface side of the opposite side thereto. In addition, the pixel 21-3 has common components with the pixel 21 of FIG. 4 in other parts, the common components are denoted by the same reference numerals and thus the detailed description thereof will be omitted. In other words, the pixel 21-3 is configured to include a transfer transistor 61, an amplifying transistor 62, a selection transistor 63, and a reset transistor 64, and is connected to a vertical signal line 23.

Further, in the pixel 21-3, light shielding electrode applying voltages $V_{FD}$ and $V_{RD}$ are respectively supplied from the vertical driving unit 13 to the engraved light shielding electrodes 57b-1 and 57b-2 in order to apply the potentials described above with reference to FIG. 15 to the engraved light shielding electrodes 57b-1 and 57b-2.

FIG. 17 illustrates, in order from the top, the selection signal SEL, the reset signal RES, the transfer signal TG, the light shielding electrode applying voltages $V_{FD}(1)$ and $V_{FD}(2)$, the light shielding electrode applying voltages $V_{RD}(1)$ and $V_{RD}(2)$, the potential level $V_{FD}$ of the FD unit 53, and the potential level $V_{SIG}$ of the vertical signal line 23.

Here, it is possible to select either the light shielding electrode applying voltage $V_{FD}(1)$ or the light shielding electrode applying voltage $V_{FD}(2)$ for use in response to the operation of the pixel 21-3. For example, the light shielding electrode applying voltage $V_{FD}(1)$ is selected for use in a case of performing a normal expected operation. In contrast, the light shielding electrode applying voltage $V_{FD}(2)$ is selected for use in a case of performing a pinning enhancement operation and a transfer assist enhancement operation. In the same manner, it is possible to select either the light shielding electrode applying voltage $V_{RD}(1)$ or the light shielding electrode applying voltage $V_{RD}(2)$ for use in response to the operation of the pixel 21-3. For example, the light shielding electrode applying voltage $V_{RD}(1)$ is selected for use in a case of performing a normal expected operation. In contrast, the light shielding electrode applying voltage $V_{RD}(2)$ is selected for use in a case of performing a transfer assist operation of approaching the vicinity of the FD unit 53 once.

Further, in FIG. 17, a timing t1 is a timing at which selecting the pixel 21-3 as a pixel which outputs a pixel signal is started, and a timing t2 is a timing at which charge transfer from the PD 52 to the FD unit 53 is started. Further, a timing t3 is a timing at which selecting the pixel 21-3 as a pixel which outputs a pixel signal is terminated.

First, if the accumulation of charges of the PD 52 is started before the timing t1 at which selecting the pixel 21-3 is started, the light shielding electrode applying voltage $V_{FD}(1)$ is switched from the low level to the high level, and the light shielding electrode applying voltage $V_{FD}(2)$ is switched from the low level to the high level. Further, similarly, the light shielding electrode applying voltages $V_{RD}(1)$ and $V_{RD}(2)$ are switched from the low level to the high level. Thus, a negative potential is applied to the engraved light shielding electrodes 57b-1 and 57b-2. In addition, the low level of the transfer signal TG is set to a negative potential and during a period other than the charge transfer period, a negative potential is applied to the gate electrode 54 of the transfer transistor 61 according to the transfer signal TG.

Accordingly, during a period of accumulation of charges in the PD 52, a negative potential is applied to the gate electrode 54 and the engraved light shielding electrodes 57b-1 and 57b-2, and as illustrated in FIG. 15A, a force pushing electrons e to the center of the PD 52 is generated.

Then, at the timing t1, the selection signal SEL is at a high level such that the pixel 21-3 is selected; and the reset signal RES is at a high level such that the potential level $V_{FD}$ of the FD unit 53 is reset. In other words, the FD unit 53 is in a state in which charges transferred to the FD unit 53 prior to the present process are left, and the charges are discharged to the power supply voltage. As a consequence of this, the potential level $V_{SIG}$ of the vertical signal line 23 varies depending on the potential level $V_{FD}$ (that is, a reset level) of the FD unit 53. Thereafter, the reset signal RES is at a low level and the potential level $V_{FD}$ of the FD unit 53 and the potential level $V_{SIG}$ of the vertical signal line 23 are stable, and then the potential level $V_{SIG}$ of the vertical signal line 23 is read as a potential of a reset level to the column processing unit 14 of FIG. 1.

Next, at the timing t2, the transfer signal TG is at a high level such that the charges accumulated in the PD 52 are transferred to the FD unit 53. In other words, at this time, a positive potential is applied to the gate electrode 54 of the transfer transistor 61 according to the transfer signal TG. Further, at the timing t2, the light shielding electrode applying voltage $V_{RD}(1)$ is at a low level such that 0 V is applied to the engraved light shielding electrode 57b-2.

Accordingly, when charges are transferred from the PD 52, a negative potential is applied to the engraved light shielding electrode 57b-1, whereas 0 V is applied to the engraved light shielding electrode 57b-1, and thus a positive potential is applied to the gate electrode 54. Thus, as illustrated in FIG. 15B, the flow of electrons e to the gate electrode 54 located on the engraved light shielding electrode 57a-2 side is assisted.

Further, at the timing t2, the light shielding electrode applying voltage $V_{FD}(2)$ is switched from the first high level to a second high level of a higher level. Accordingly, if the light shielding electrode applying voltage $V_{FD}(2)$ is selected for use, when charges are transferred from the PD 52, a negative potential corresponding to the second high level which is higher than the negative potential corresponding to the first high level is applied to the engraved light shielding electrode 57b-1.

In addition, the light shielding electrode applying voltage $V_{RD}(2)$ is at a low level at a predetermined timing before the timing t2, and thus 0 V is applied to the engraved light shielding electrode 57b-2. Thus, prior to the charge transfer, an assist of causing electrons e to approach the vicinity of the FD unit 53 is performed first.

Then, if charges are transferred from the PD 52 to the FD unit 53, the potential level $V_{FD}$ of the FD unit 53 and the potential level $V_{SIG}$ of the vertical signal line 23 vary depending on the amount of charges transferred to the FD unit 53. Thereafter, after the transfer signal TG is at a low level and the transfer of charges is terminated and the potential level $V_{FD}$ of the FD unit 53 and the potential level $V_{SIG}$ of the vertical signal line 23 are stable, the potential level $V_{SIG}$ of the vertical signal line 23 is read out to the column processing unit 14 of FIG. 1 as a potential of the pixel signal level.

Thereafter, at the timing t3, the selection signal SEL is at a low level and thus the selection of the pixel 21-3 is terminated. At this time, the light shielding electrode applying voltage $V_{FD}(1)$ is switched from a high level to a low level, and the light shielding electrode applying voltage $V_{FD}(2)$ is switched from the second high level to the low level.

Figure 18A:
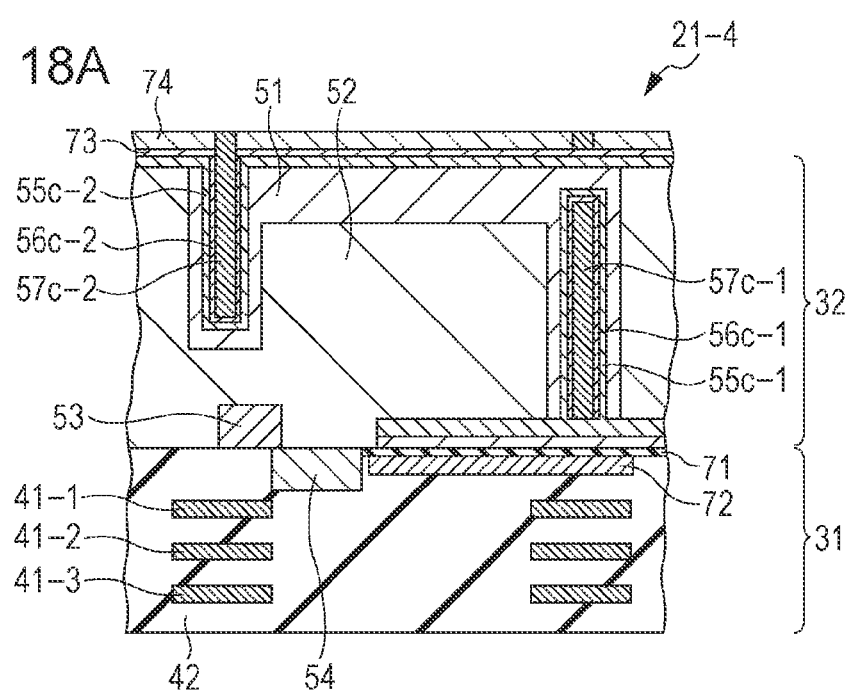
FIGS. 18A to 18C are diagrams illustrating a fifth configuration example of a pixel.
Figure 18B:
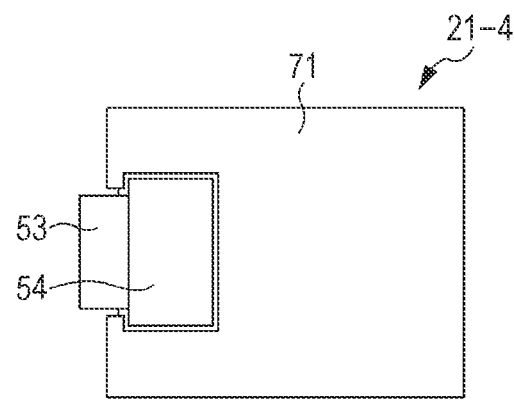
Figure 18C:
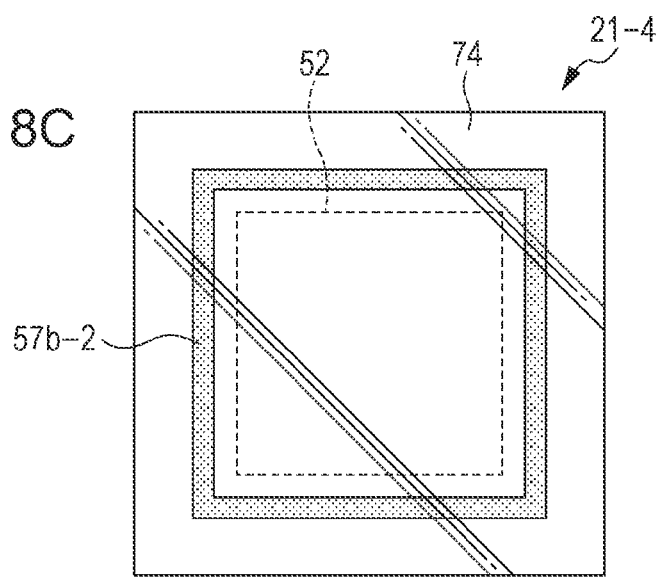

Next, FIGS. 18A to 18C are diagrams illustrating a fifth configuration example of the pixel 21 included in the solid-state imaging device 11.

FIG. 18A illustrates a cross-sectional configuration example of the pixel 21-4 which is the fifth configuration example, FIG. 18B illustrates a planar configuration example of the pixel 21-4 as viewed from the opposite surface side, and FIG. 18C illustrates a planar configuration example of the pixel 21-4 as viewed from the light incident surface side.

As illustrated in FIGS. 18A to 18C, the pixel 21-4 has a different configuration from the pixel 21 of FIGS. 2A to 2C in that the engraved light shielding electrode 57 is divided into the engraved light shielding electrodes 57b-1 and 57b-2. In addition, otherwise, the pixel 21-4 has a different configuration from the pixel 21 of FIGS. 2A to 2C in that a planar electrode 72 is laminated on the opposite surface side of the semiconductor substrate 51 through the insulating film 71, and a transparent conductive film 74 is laminated on the light incident surface side of the semiconductor substrate 51 through the barrier metal 73. In addition, otherwise, the pixel 21-4 has common components with the pixel 21 of FIGS. 2A to 2C, the common components are denoted by the same reference numerals and thus the detailed description thereof will be omitted. In other words, the pixel 21-4 has a configuration common to the pixel 21 of FIGS. 2A to 2C in that a PD 52 and an FD unit 53 are formed on the semiconductor substrate 51 and a gate electrode 54 is laminated on an opposite surface side of the semiconductor substrate 51.

Here, in the pixel 21-4, the engraved light shielding electrodes 57b-1 and 57b-2 are configured in the same manner as the engraved light shielding electrodes 57b-1 and 57b-2 of the pixel 21-3 illustrated in FIGS. 14A to 14C. Further, the insulating film 71, the planar electrode 72, the barrier metal 73, and the transparent conductive film 74 in the pixel 21-4 are configured in the same manner as the insulating film 71, the planar electrode 72, the barrier metal 73, and the transparent conductive film 74 of the pixel 21-1 illustrated in FIGS. 6A to 6C.

An operation of a potential applied during the charge accumulation period and during the charge transfer period will be described with reference to FIGS. 19A and 19B.

Figure 19A:
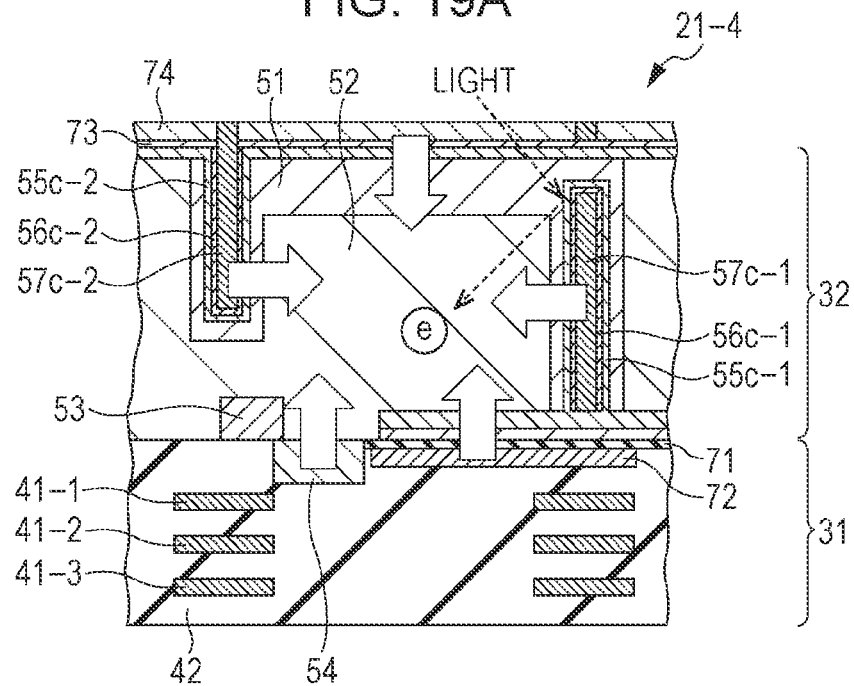
FIGS. 19A and 19B are diagrams illustrating an operation of a potential applied during a charge accumulation period and during a charge transfer period.
Figure 19B:
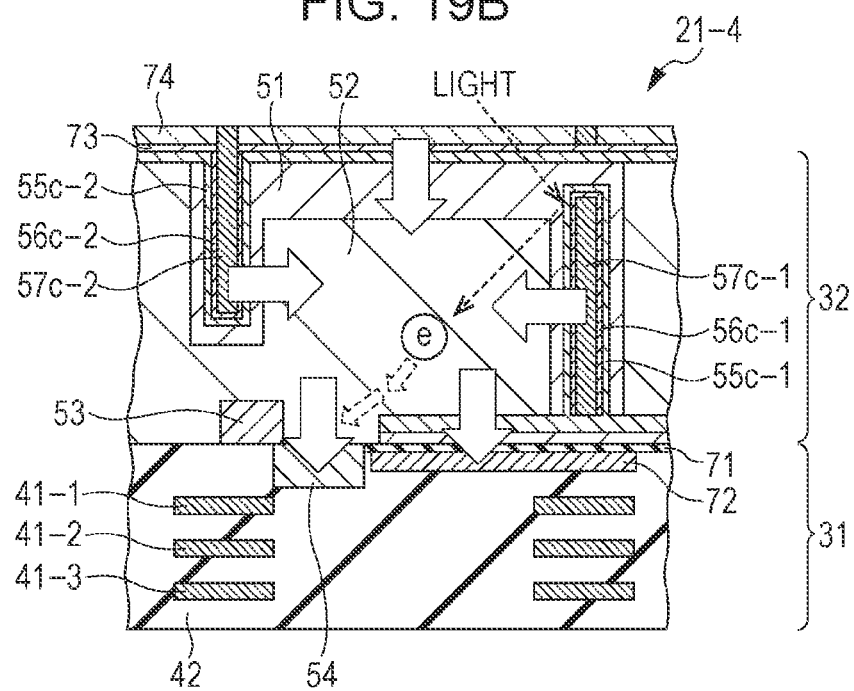

FIG. 19A illustrates the pixel 21-4 during the charge accumulation period, and FIG. 19B illustrates the pixel 21-4 during the charge transfer period. In addition, the light incident on the pixel 21-4 is converted into electrons e in the PD 52. Further, as illustrated in FIGS. 19A and 19B, the light incident on the pixel 21-4 in an oblique direction is prevented from leaking to other adjacent pixels 21 by being reflected on the engraved light shielding electrode 57.

As illustrated in FIG. 19A, in the pixel 21-4, a negative potential is applied to the gate electrode 54, the engraved light shielding electrodes 57b-1 and 57b-2, the planar electrode 72, and the transparent conductive film 74 during the charge accumulation period. Thus, as indicated by the hollow arrows in FIG. 19A, a force pushing electrons e to the center of the PD 52 is generated. Accordingly, the pixel 21-4 can deepen the potential well of the PD 52 during the charge accumulation period and increase the saturation charge amount of the PD 52. Further, in the pixel 21-4, it is possible to suppress the generation of a dark current by applying a negative potential.

Further, during the charge transfer period, in the pixel 21-4, a negative potential is applied to the engraved light shielding electrodes 57b-1 and 57b-2 and the transparent conductive film 74, whereas a positive potential is applied to the gate electrode 54 and the planar electrode 72. Thus, as indicated by the hollow arrows in FIG. 19B, a force pushing electrons e to the center of the PD 52 and the opposite surface is generated. Accordingly, as indicated by the hollow arrows of a dashed line in FIG. 19B, in the pixel 21-4, it is possible to assist the flow of the electrons e to the gate electrode 54 which is located on the opposite surface, and to improve the transfer performance of charges from the PD 52 to the FD unit 53.

In this manner, it is possible to increase the saturation charge amount of the PD 52 and to suppress the generation of a dark current during the charge accumulation period, whereas it is possible to improve the transfer performance of charges during the charge transfer period, thereby improving the characteristics of the pixel 21-4.

Next, a driving method of the pixel 21-4 will be described with reference to FIGS. 20 and 21.

Figure 20:
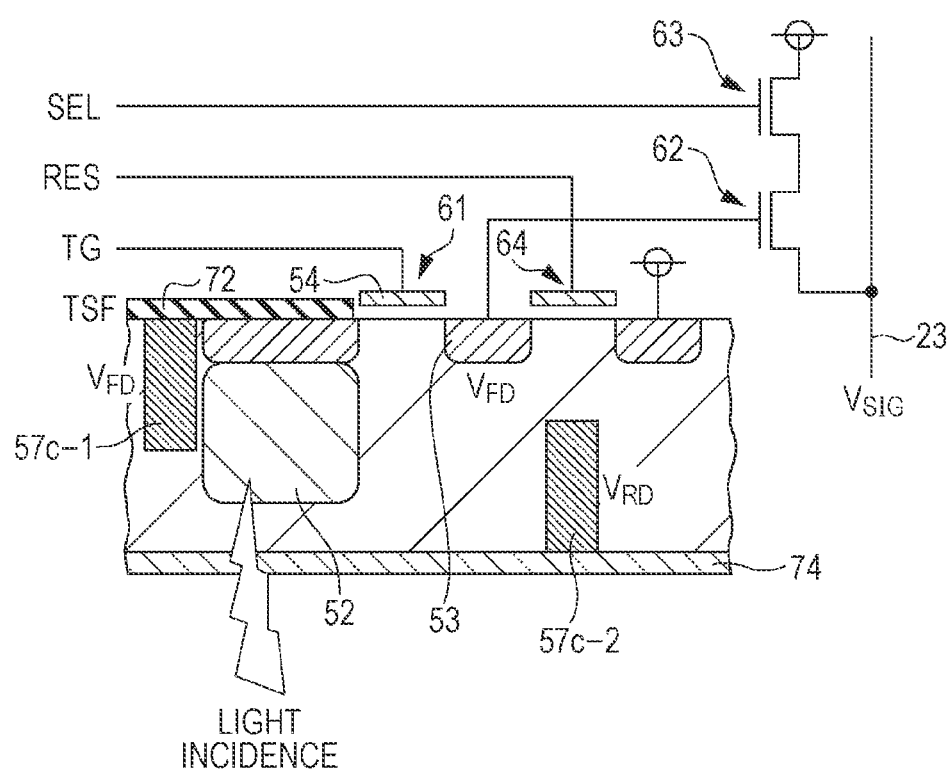
FIG. 20 is a diagram illustrating a circuit configuration of a pixel.

FIG. 20 illustrates a circuit configuration of the pixel 21-4. FIG. 21 illustrates a drive signal supplied to the pixel 21-4 and potentials of respective units in the pixel 21-4.

As illustrated in FIG. 20, the pixel 21-4 has a different configuration from the pixel 21 of FIG. 4 in that an engraved light shielding electrode 57c-2 is disposed on the light incident surface side of the FD unit 53 side of the PD 52, and an engraved light shielding electrode 57c-1 is disposed on the opposite surface side of the opposite side thereto. Further, the pixel 21-4 has a different configuration from the pixel 21 of FIG. 4 in that a planar electrode 72 is disposed on the opposite surface side of the sensor layer 32 and a transparent conductive film 74 is disposed on the light incident surface side of the sensor layer 32. In addition, the pixel 21-4 has common components with the pixel 21 of FIG. 4 in other parts, the common components are denoted by the same reference numerals and thus the detailed description thereof will be omitted. In other words, the pixel 21-4 is configured to include a transfer transistor 61, an amplifying transistor 62, a selection transistor 63, and a reset transistor 64, and is connected to a vertical signal line 23.

Further, in the pixel 21-4, light shielding electrode applying voltages $V_{FD}$ and $V_{RD}$ are respectively supplied from the vertical driving unit 13 to the engraved light shielding electrodes 57c-1 and 57c-2 in order to apply the potentials described above with reference to FIGS. 19A and 19B to the engraved light shielding electrodes 57c-1 and 57c-2. Similarly, in the pixel 21-4, a planar electrode applying voltage $V_{TSF}$ is supplied from the vertical driving unit 13 to the planar electrode 72 in order to apply the potentials described above with reference to FIGS. 19A and 19B to the planar electrode 72. Further, a transparent conductive film applying voltage $V_{TR}$ is supplied from the vertical driving unit 13 to the transparent conductive film 74 in order to apply the potentials described above with reference to FIGS. 19A and 19B to the transparent conductive film 74.

Figure 21:
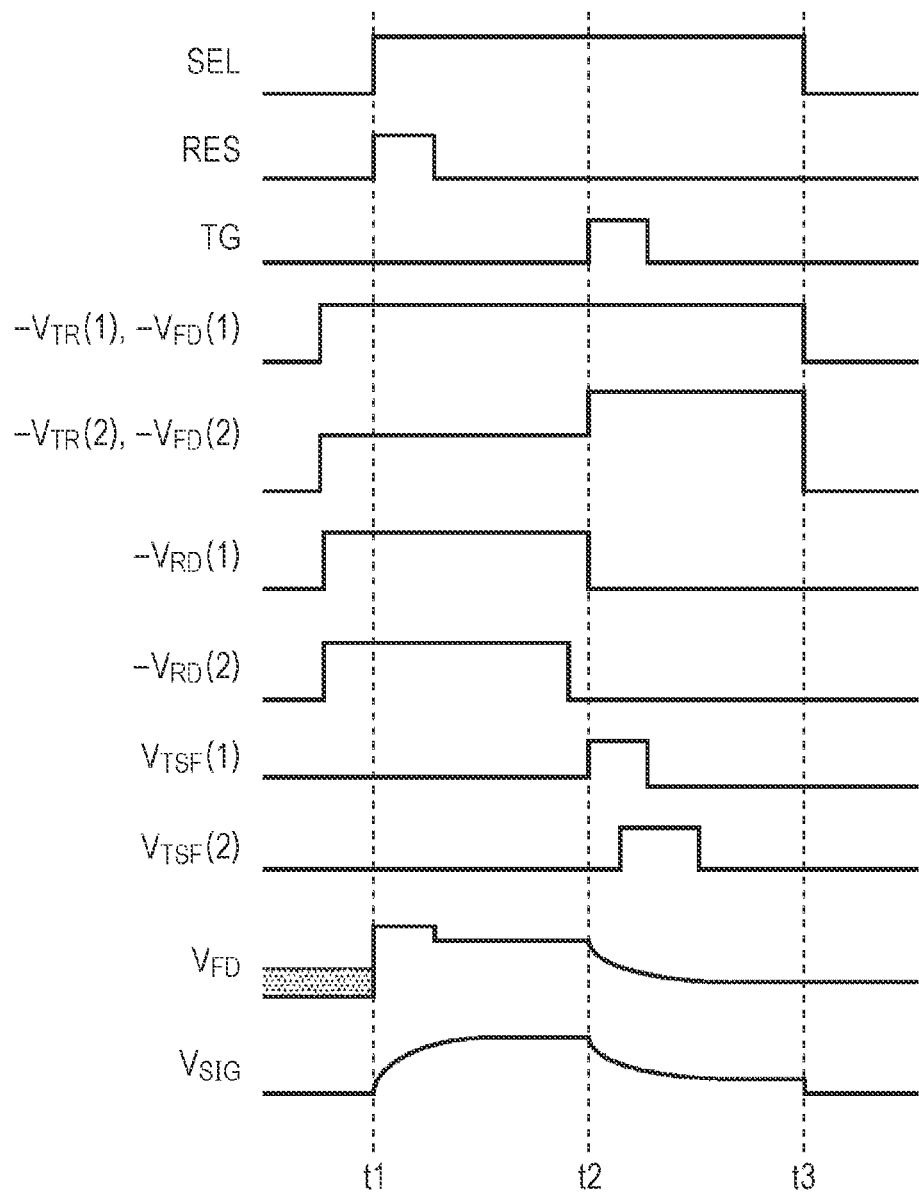
FIG. 21 is a diagram illustrating a drive signal supplied to a pixel and potentials of respective units in the pixel.

FIG. 21 illustrates, in order from the top, the selection signal SEL, the reset signal RES, the transfer signal TG, the transparent conductive film applying voltages $V_{TR}(1)$ and $V_{TR}(2)$, the light shielding electrode applying voltages $V_{FD}(1)$ and $V_{FD}(2)$, the light shielding electrode applying voltages $V_{RD}(1)$ and $V_{RD}(2)$, the planar electrode applying voltages $V_{TSF}(1)$ and $V_{TSF}(2)$, the potential level $V_{FD}$ of the FD unit 53, and the potential level $V_{SIG}$ of the vertical signal line 23.

Here, the light shielding electrode applying voltage $V_{FD}(1)$ and the transparent conductive film applying voltage $V_{TR}(1)$ are common, and the light shielding electrode applying voltage $V_{FD}(2)$ and the transparent conductive film applying voltage $V_{TR}(2)$ are common. Further, the transparent conductive film applying voltages $V_{TR}(1)$ and $V_{TR}(2)$, the light shielding electrode applying voltage $V_{FD}(1)$ and $V_{FD}(2)$, and the light shielding electrode applying voltages $V_{RD}(1)$ and $V_{RD}(2)$ are represented as inverted signals, and when the applying voltages are at high levels, a negative potential is applied. In addition, the low level of the planar electrode applying voltages $V_{TSF}(1)$ and $V_{TSF}(2)$ is a negative potential, and the high level of the planar electrode applying voltage $V_{TSF}(1)$ and $V_{TSF}(2)$ is a positive potential.

Further, it is possible to select either a pair of the light shielding electrode applying voltage $V_{FD}(1)$ and the transparent conductive film applying voltage $V_{TR}(1)$ or a pair of the light shielding electrode applying voltage $V_{FD}(2)$ and the transparent conductive film applying voltage $V_{TR}(2)$ for use in response to the operation of the pixel 21-4. For example, the pair of the light shielding electrode applying voltage $V_{FD}(1)$ and the transparent conductive film applying voltage $V_{TR}(1)$ is selected for use in a case of performing a normal expected operation. In contrast, the pair of the light shielding electrode applying voltage $V_{FD}(2)$ and the transparent conductive film applying voltage $V_{TR}(2)$ is selected for use in a case of performing a pinning enhancement operation and a transfer assist enhancement operation.

In the same manner, it is possible to select either the light shielding electrode applying voltage $V_{RD}(1)$ or the light shielding electrode applying voltage $V_{RD}(2)$ for use in response to the operation of the pixel 21-4. For example, the light shielding electrode applying voltage $V_{RD}(1)$ is selected for use in a case of performing a normal expected operation. In contrast, the light shielding electrode applying voltage $V_{RD}(2)$ is selected for use in a case of performing a transfer assist operation of approaching the vicinity of the FD unit 53 once.

In the same manner, it is possible to select either the planar electrode applying voltage $V_{TSF}(1)$ or the planar electrode applying voltage $V_{TSF}(2)$ for use in response to the operation of the pixel 21-4. For example, the planar electrode applying voltage $V_{TSF}(1)$ is selected for use in a case of performing a normal expected operation. In contrast, the planar electrode applying voltage $V_{TSF}(2)$ is selected for use in a case of performing an operation of performing a transfer while causing charges to approach the vicinity of the opposite surface.

Further, in FIG. 21, a timing t1 is a timing at which selecting the pixel 21-4 as a pixel which outputs a pixel signal is started, and a timing t2 is a timing at which charge transfer from the PD 52 to the FD unit 53 is started. Further, a timing t3 is a timing at which selecting the pixel 21-4 as a pixel which outputs a pixel signal is terminated.

First, if the accumulation of charges of the PD 52 is started before the timing t1 at which selecting the pixel 21-4 is started, the light shielding electrode applying voltage $V_{FD}(1)$ and the transparent conductive film applying voltage $V_{TR}(1)$ are switched from the low level to the high level. Further, similarly, the light shielding electrode applying voltage $V_{FD}(2)$ and the transparent conductive film applying voltage $V_{TR}(2)$ are switched from the low level to a first high level. Furthermore, similarly, the light shielding electrode applying voltages $V_{RD}(1)$ and $V_{RD}(2)$ are switched from the low level to the high level. Thus, a negative potential is applied to the engraved light shielding electrodes 57c-1 and 57c-2 and the transparent conductive film 74. Further, at this time, the planar electrode applying voltages $V_{TSF}(1)$ and $V_{TSF}(2)$ are at a low level, and a negative potential is applied to the planar electrode 72. In addition, the low level of the transfer signal TG is set to a negative potential and during a period other than the charge transfer period, a negative potential is applied to the gate electrode 54 of the transfer transistor 61 according to the transfer signal TG.

Accordingly, during a period of accumulation of charges in the PD 52, a negative potential is applied to the gate electrode 54, the engraved light shielding electrodes 57b-1 and 57b-2, the planar electrode 72, and the transparent conductive film 74, and as illustrated in FIG. 19A, a force pushing electrons e to the center of the PD 52 is generated.

Then, at the timing t1, the selection signal SEL is at a high level such that the pixel 21-4 is selected; and the reset signal RES is at a high level such that the potential level $V_{FD}$ of the FD unit 53 is reset. In other words, the FD unit 53 is in a state in which charges transferred to the FD unit 53 prior to the present process are left, and the charges are discharged to the power supply voltage. As a consequence of this, the potential level $V_{SIG}$ of the vertical signal line 23 varies depending on the potential level $V_{FD}$(that is, a reset level) of the FD unit 53. Thereafter, the reset signal RES is at a low level and the potential level $V_{FD}$ of the FD unit 53 and the potential level $V_{SIG}$ of the vertical signal line 23 are stable, and then the potential level $V_{SIG}$ of the vertical signal line 23 is read as a potential of a reset level to the column processing unit 14 of FIG. 1.

Next, at the timing t2, the transfer signal TG is at a high level such that the charges accumulated in the PD 52 are transferred to the FD unit 53. In other words, at this time, a positive potential is applied to the gate electrode 54 of the transfer transistor 61 according to the transfer signal TG. Further, simultaneously with the transfer signal TG, the planar electrode applying voltage $V_{TSF}(1)$ is at a low level such that a positive potential is applied to the planar electrode 72 according to the planar electrode applying voltage $V_{TSF}(1)$.

Accordingly, when charges are transferred from the PD 52, a negative potential is applied to the engraved light shielding electrode 57 and the transparent conductive film 74, whereas a positive potential is applied to the gate electrode 54 and the planar electrode 72, such that as illustrated in FIG. 19B, the flow of electrons e to the gate electrode 54 is assisted.

Further, at the timing t2, the light shielding electrode applying voltage $V_{FD}(2)$ and the transparent conductive film applying voltage $V_{TR}(2)$ are switched from the first high level to a second high level of a higher level. Accordingly, if the light shielding electrode applying voltage $V_{FD}(2)$ and the transparent conductive film applying voltage $V_{TR}(2)$ are selected for use, when charges are transferred from the PD 52, a negative potential corresponding to the second high level which is higher than the negative potential corresponding to the first high level is applied to the engraved light shielding electrode 57 and the transparent conductive film 74.

In addition, the light shielding electrode applying voltage $V_{RD}(2)$ is at a low level at a predetermined timing before the timing t2, and thus 0 V is applied to the engraved light shielding electrode 57b-2. Thus, prior to the charge transfer, an assist of causing electrons e to approach the vicinity of the FD unit 53 is performed first.

Then, if charges are transferred from the PD 52 to the FD unit 53, the potential level $V_{FD}$ of the FD unit 53 and the potential level $V_{SIG}$ of the vertical signal line 23 vary depending on the amount of charges transferred to the FD unit 53. Thereafter, after the transfer signal TG and the planar electrode applying voltage $V_{TSF}(1)$ are at a low level and the transfer of charges is terminated and the potential level $V_{FD}$ of the FD unit 53 and the potential level $V_{SIG}$ of the vertical signal line 23 are stable, the potential level $V_{SIG}$ of the vertical signal line 23 is read out to the column processing unit 14 of FIG. 1 as a potential of the pixel signal level.

Here, the planar electrode applying voltage $V_{TSF}(2)$ is at a high level at a predetermined timing later than the planar electrode applying voltage $V_{TSF}(1)$. In other words, when the planar electrode applying voltage $V_{TSF}(2)$ is selected for use, a positive potential is applied to the planar electrode 72 at a timing later than a timing at which a positive potential is applied to the gate electrode 54. Thus, for example, when charges are transferred from the PD 52 to the FD unit 53, electrons e are drawn to the opposite surface side of the semiconductor substrate 51 after the flow of electrons e to the gate electrode 54 is formed, such that the leakage of electrons e along the opposite surface of the semiconductor substrate 51 is prevented.

Thereafter, at the timing t3, the selection signal SEL is at a low level and thus the selection of the pixel 21-4 is terminated. At this time, the light shielding electrode applying voltage $V_{FD}(2)$ and the transparent conductive film applying voltage $V_{TR}(2)$ are switched from a high level to a low level. In the same manner, the light shielding electrode applying voltage $V_{FD}(2)$ and the transparent conductive film applying voltage $V_{TR}(2)$ are switched from the second high level to the low level.

Further, the solid-state imaging device 11 described above can be applied to various electronic apparatuses including imaging systems such as digital still cameras and digital video cameras, mobile phones with an imaging function, or other apparatuses with an imaging function.

Figure 22:
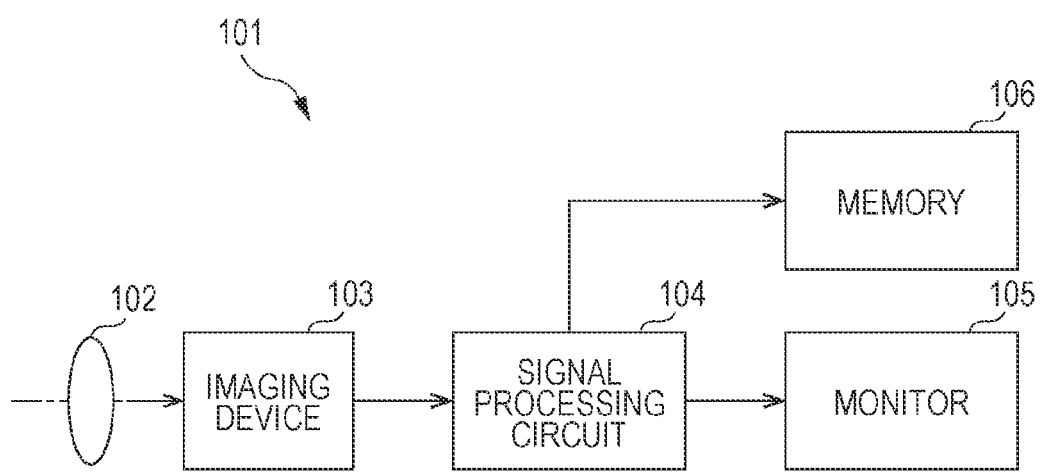
FIG. 22 is a block diagram illustrating a configuration example of an imaging apparatus mounted on an electronic apparatus.

FIG. 22 is a block diagram illustrating a configuration example of an imaging apparatus mounted on an electronic apparatus.

As illustrated in FIG. 22, an imaging apparatus 101 is configured to include an optical system 102, an imaging device 103, a signal processing circuit 104, a monitor 105, and a memory 106, and is capable of capturing still images and moving images.

The optical system 102 is configured to include one or a plurality of lenses, and guides image light (incident light) from an object to the imaging device 103 so as to focus the image light on a light receiving surface (sensor unit) of the imaging device 103.

As the imaging device 103, a solid-state imaging device 11 including phase difference pixels 21a of various configuration examples described above is applied. Electrons are accumulated in the imaging device 103 for a fixed period, according to an image focused on the light receiving surface through the optical system 102. Thus, signals according to the electrons accumulated in the imaging device 103 are supplied to the signal processing circuit 104.

The signal processing circuit 104 performs various signal processes on the pixel signals which are output from the imaging device 103. The image (image data) obtained by the signal processing circuit 104 performing the signal processes is supplied to and displayed on the monitor 105, or is supplied to and stored (recorded) in the memory 106.

In the imaging apparatus 101 configured in this manner, it is possible to obtain, for example, an image with less noise even at a low intensity of illumination by employing the solid-state imaging device 11 including the pixel 21 of various configuration examples described above.

In addition, the present technology may have the following configurations.

(1)

A solid-state imaging device including:

a photoelectric conversion unit that generates charges by photoelectrically converting light;

a light shielding unit that is formed by engraving a semiconductor substrate on which the photoelectric conversion unit is formed, so as to surround an outer periphery of the photoelectric conversion unit; and a transfer transistor that transfers charges generated in the photoelectric conversion unit, wherein during a charge accumulation period in which charges are accumulated in the photoelectric conversion unit, a potential that repels the charges is supplied to the light shielding unit and a gate electrode of the transfer transistor, and wherein during a charge transfer period in which charges are transferred from the photoelectric conversion unit, a potential that repels the charges is supplied to the light shielding unit and a potential that attracts the charges is supplied to the gate electrode of the transfer transistor.

(2)

The solid-state imaging device according to (1), further including:

a conductive film having optical transparency laminated on a light incident surface side on which light enters the photoelectric conversion unit, with respect to the semiconductor substrate on which the photoelectric conversion unit is formed, wherein during the charge accumulation period and during the charge transfer period, the potential that repels the charges is supplied to the conductive film.

(3)

The solid-state imaging device according to (1) or (2), further including:

a planar electrode laminated in a plane manner on an opposite surface side which is opposite to the light incident surface side on which light enters the photoelectric conversion unit, with respect to the semiconductor substrate on which the photoelectric conversion unit is formed, wherein during the charge accumulation period, the potential that repels the charges is supplied to the planar electrode, and wherein during the charge transfer period, the potential that attracts the charges is supplied to the planar electrode.

(4)

The solid-state imaging device according to any one of (1) to (3), wherein a part of the light shielding unit is formed on a light incident surface side on which light enters the photoelectric conversion unit, with respect to the semiconductor substrate on which the photoelectric conversion unit is formed, and another part of the light shielding unit is formed on an opposite surface side which is opposite to the light incident surface side, and respective potentials are independently supplied to the part and the other part of the light shielding unit.

(5)

The solid-state imaging device according to any one of (1) to (4), further including:

a conductive film having optical transparency laminated on a light incident surface side on which light enters the photoelectric conversion unit, with respect to the semiconductor substrate on which the photoelectric conversion unit is formed, and a planar electrode laminated in a plane manner on an opposite surface side which is opposite to the light incident surface side on which light enters the photoelectric conversion unit, with respect to the semiconductor substrate on which the photoelectric conversion unit is formed, wherein a part of the light shielding unit is formed on the light incident surface side on which light enters the photoelectric conversion unit, with respect to the semiconductor substrate on which the photoelectric conversion unit is formed, and the other part of the light shielding unit is formed on an opposite surface side which is opposite to the light incident surface side, and respective potentials are independently supplied to the gate electrode of the transfer transistor, the conductive film, the planar electrode, the part and the other part of the light shielding unit.

(6) A driving method of a solid-state imaging device including a photoelectric conversion unit that generates charges by photoelectrically converting light, a light shielding unit that is formed by engraving a semiconductor substrate on which the photoelectric conversion unit is formed, so as to surround an outer periphery of the photoelectric conversion unit, and a transfer transistor that transfers charges generated in the photoelectric conversion unit, including:

supplying a potential that repels the charges to the light shielding unit and a gate electrode of the transfer transistor, during a charge accumulation period in which charges are accumulated in the photoelectric conversion unit; and supplying the potential that repels the charges to the light shielding unit and supplying a potential that attracts the charges to the gate electrode of the transfer transistor, during a charge transfer period in which charges are transferred from the photoelectric conversion unit.

(7) An electronic apparatus including:
a solid-state imaging device including:
a photoelectric conversion unit that generates charges by photoelectrically converting light;
a light shielding unit that is formed by engraving a semiconductor substrate on which the photoelectric conversion unit is formed, so as to surround an outer periphery of the photoelectric conversion unit; and
a transfer transistor that transfers charges generated in the photoelectric conversion unit,
wherein during a charge accumulation period in which charges are accumulated in the photoelectric conversion unit, a potential that repels the charges is supplied to the light shielding unit and a gate electrode of the transfer transistor, and
wherein during a charge transfer period in which charges are transferred from the photoelectric conversion unit, a potential that repels the charges is supplied to the light shielding unit and a potential that attracts the charges is supplied to the gate electrode of the transfer transistor.

It should be understood that the disclosure is not limited to the above-described embodiments, but may be modified into various forms in a range without departing from a gist of the disclosure.

What is claimed is:

1. An imaging device comprising:
   a semiconductor substrate including a photoelectric conversion unit configured to generate charges by photoelectrically converting light;
   a trench portion formed in the semiconductor substrate so as to surround an outer periphery of the photoelectric conversion unit;
   a light-shielding unit including a light-shielding electrode and a fixed-charge film within the trench portion;
   a transfer transistor configured to transfer charges generated in the photoelectric conversion unit; and
   a planar electrode at a side of the semiconductor substrate that is opposite to a light-incident side of the semiconductor substrate,
   wherein,
   during a charge accumulation period in which charges are accumulated in the photoelectric conversion unit, a potential that repels the charges is supplied to the light-shielding electrode and a gate electrode of the transfer transistor and a potential that repels the charges is supplied to the planar electrode,
   during a charge transfer period in which charges are transferred from the photoelectric conversion unit, a potential that repels the charges is supplied to the light-shielding electrode and a potential that attracts the charges is supplied to the gate electrode of the transfer transistor and the planar electrode, and
   the gate electrode of the transfer transistor and the planar electrode are disposed in a same interlayer insulating film.

2. The imaging device according to claim 1, further comprising:
   a conductive film at the light-incident side of the semiconductor substrate, wherein during the charge accumulation period and during the charge transfer period, the potential that repels the charges is supplied to the conductive film.

3. The imaging device according to claim 1, wherein the potential that repels the charges is supplied to the light-shielding unit from a vertical driving unit.

4. The imaging device according to claim 1, wherein the light-shielding unit further includes a barrier metal disposed between the light-shielding electrode and the fixed-charge film.

5. The imaging device according to claim 1, wherein the fixed-charge film surrounds the light-shielding electrode on at least three sides.

6. The imaging device according to claim 1, wherein the fixed charge film is disposed above the photoelectric conversion unit such that the photoelectric conversion unit is between the gate electrode of the transfer transistor and the fixed-charge film.

7. The imaging device according to claim 1, further including a wiring layer disposed at a side of the semiconductor substrate.

8. The imaging device according to claim 7, wherein a portion of the semiconductor substrate is disposed between the light-shielding unit and the wiring layer.

9. An electronic apparatus comprising:
   an imaging device including:
   a semiconductor substrate including a photoelectric conversion unit configured to generate charges by photoelectrically converting light,
   a trench portion formed in the semiconductor substrate so as to surround an outer periphery of the photoelectric conversion unit,
   a light-shielding unit including a light-shielding electrode and a fixed-charge film within the trench portion,
   a transfer transistor configured to transfer charges generated in the photoelectric conversion unit, and
   a planar electrode at a side of the semiconductor substrate that is opposite to a light-incident side of the semiconductor substrate,
   wherein,
   during a charge accumulation period in which charges are accumulated in the photoelectric conversion unit, a potential that repels the charges is supplied to the light-shielding electrode and a gate electrode of the transfer transistor and a potential that repels the charges is supplied to the planar electrode,
   during a charge transfer period in which charges are transferred from the photoelectric conversion unit, a potential that repels the charges is supplied to the light-shielding electrode and a potential that attracts the charges is supplied to the gate electrode of the transfer transistor and the planar electrode, and the gate electrode of the transfer transistor and the planar electrode are disposed in a same interlayer insulating film; and a lens configured to guide light toward a light-receiving surface of the imaging device.

10. The electronic apparatus according to claim 9, further comprising:

a conductive film at the light-incident side of the semiconductor substrate, wherein during the charge accumulation period and during the charge transfer period, the potential that repels the charges is supplied to the conductive film.

11. The electronic apparatus according to claim 9, wherein the potential that repels the charges is supplied to the light-shielding unit from a vertical driving unit.

12. The electronic apparatus according to claim 9, wherein the light-shielding unit further includes a barrier metal disposed between the light-shielding electrode and the fixed-charge film.

13. The electronic apparatus according to claim 9, wherein the fixed-charge film surrounds the light-shielding electrode on at least three sides.

14. The electronic apparatus according to claim 9, wherein the fixed-charge film is disposed above the photoelectric conversion unit such that the photoelectric conversion unit is between the gate electrode of the transfer transistor and the fixed-charge film.

15. The electronic apparatus according to claim 9, further including a wiring layer disposed at a side of the semiconductor substrate.

16. The electronic apparatus according to claim 15, wherein a portion of the semiconductor substrate is disposed between the light-shielding unit and the wiring layer.

17. A method of driving an imaging device including a photoelectric conversion unit that generates charges by photoelectrically converting light, a trench portion formed in a semiconductor substrate so as to surround an outer periphery of the photoelectric conversion unit, a light-shielding unit including a light-shielding electrode and a fixed-charge film within the trench portion, a transfer transistor including a gate electrode, the transfer transistor configured to transfer charges generated in the photoelectric conversion unit, and a planar electrode at a side of the semiconductor substrate that is opposite to a light-incident side of the semiconductor substrate, wherein the gate electrode of the transfer transistor and the planar electrode are disposed in a same interlayer insulating film, the method comprising:

during a charge accumulation period in which charges are accumulated in the photoelectric conversion unit, supplying a potential that repels the charges to the light-shielding electrode and the gate electrode of the transfer transistor, and supplying a potential that repels the charges to the planar electrode; and during a charge transfer period in which charges are transferred from the photoelectric conversion unit, supplying a potential that repels the charges to the light-shielding electrode, and supplying a potential that attracts the charges to the gate electrode of the transfer transistor and the planar electrode.

* * * * *